(12) United States Patent
Suehiro et al.

(10) Patent No.: US 8,894,245 B2
(45) Date of Patent: Nov. 25, 2014

(54) LIGHT-EMITTING DEVICE AND METHOD OF MANUFACTURING THE SAME

(75) Inventors: Yoshinobu Suehiro, Aichi-ken (JP); Koji Tasumi, Aichi-ken (JP)

(73) Assignee: Toyoda Gosei Co., Ltd., Kiyosu-Shi, Aichi-Ken (JP)

(*) Notice: Subject to any disclaimer, the term of this patent is extended or adjusted under 35 U.S.C. 154(b) by 600 days.

(21) Appl. No.: 12/656,938

(22) Filed: Feb. 19, 2010

(65) Prior Publication Data
US 2010/0214777 A1 Aug. 26, 2010

(30) Foreign Application Priority Data
Feb. 24, 2009 (JP) .................................. 2009-040765

(51) Int. Cl.
| | |
|---|---|
| *F21V 29/00* | (2006.01) |
| *F21S 8/10* | (2006.01) |
| *F21S 4/00* | (2006.01) |
| *F21V 7/00* | (2006.01) |
| *F21Y 101/02* | (2006.01) |
| *F21Y 103/00* | (2006.01) |

(52) U.S. Cl.
CPC ........... *F21V 29/004* (2013.01); *F21Y 2101/02* (2013.01); *F21V 29/225* (2013.01); *F21S 48/328* (2013.01); *F21V 29/2243* (2013.01); *F21Y 2103/003* (2013.01); *F21S 4/008* (2013.01); *F21V 7/005* (2013.01); *F21V 29/2262* (2013.01); *Y10S 362/80* (2013.01)
USPC ...... 362/294; 362/243; 362/247; 362/249.02; 362/373; 362/311.02; 362/311.15; 362/645; 362/800

(58) Field of Classification Search
USPC ............ 362/243, 247, 249.02, 218, 294, 373, 362/311.2, 311.15, 645, 800, 311.02
See application file for complete search history.

(56) References Cited

U.S. PATENT DOCUMENTS

| | | | | |
|---|---|---|---|---|
| 5,670,797 A | * | 9/1997 | Okazaki | .......................... 257/91 |
| 6,428,189 B1 | * | 8/2002 | Hochstein | ..................... 362/373 |

(Continued)

FOREIGN PATENT DOCUMENTS

| | | |
|---|---|---|
| JP | 1-143227 | 6/1989 |
| JP | 2003-347600 A | 12/2003 |

(Continued)

OTHER PUBLICATIONS

Japanese Office Action dated Jun. 28, 2011, with partial English translation.
Japanese Office Action dated Feb. 7, 2012, with partial English translation.

*Primary Examiner* — Thomas M. Sember
*Assistant Examiner* — Tsion Tumebo
(74) *Attorney, Agent, or Firm* — McGinn IP Law Group, PLLC

(57) ABSTRACT

A light-emitting device includes a light emitting portion including a substrate having a mounting surface for mounting an LED element and a metal portion formed on a surface of the substrate opposite to the mounting surface, the substrate including a ceramic or a semiconductor and the metal portion being bondable to a solder material and a heat dissipating member including one of aluminum, an aluminum alloy, magnesium, and a magnesium alloy, and having, on a surface thereof, a junction treated so as to be bondable to the solder material and a heat dissipating film formed in a periphery of the junction, wherein the metal portion of the light emitting portion is bonded to the junction of the heat dissipating member by the solder material.

19 Claims, 18 Drawing Sheets

(56) References Cited

U.S. PATENT DOCUMENTS

| | | | |
|---|---|---|---|
| 7,055,987 B2* | 6/2006 | Staufert | 362/235 |
| 7,196,459 B2* | 3/2007 | Morris | 313/46 |
| 7,284,882 B2* | 10/2007 | Burkholder | 362/294 |
| 7,642,704 B2 | 1/2010 | Imai et al. | |
| 2001/0010449 A1* | 8/2001 | Chiu et al. | 313/501 |
| 2006/0049335 A1* | 3/2006 | Suehiro et al. | 250/214.1 |
| 2007/0007540 A1* | 1/2007 | Hashimoto et al. | 257/94 |
| 2007/0058357 A1 | 3/2007 | Yamaguchi et al. | |
| 2007/0064131 A1* | 3/2007 | Sawanobori et al. | 348/294 |
| 2007/0237197 A1 | 10/2007 | Chikugawa | |
| 2009/0115833 A1* | 5/2009 | Soulliaert et al. | 347/238 |

FOREIGN PATENT DOCUMENTS

| | | |
|---|---|---|
| JP | 2006-5290 | 1/2006 |
| JP | 2006-303396 | 11/2006 |
| JP | 2007-81234 A | 3/2007 |
| JP | 2007-214249 | 8/2007 |
| JP | 2007-281146 | 10/2007 |
| JP | 2007-317701 | 12/2007 |
| JP | 3138726 U | 1/2008 |
| JP | 2008-34540 A | 2/2008 |
| JP | 2008-198702 A | 8/2008 |
| JP | 2009-4659 A | 1/2009 |

\* cited by examiner

Fig.5

| | Longitudinal Dimension of Contact Area | Width Dimension of Contact Area | Contact Area | Input Power | Contact Area/Input power | Difference of Temperature between Light Emitting Portion and Fin |
|---|---|---|---|---|---|---|
| | mm | mm | mm² | (W) | mm²/W | (°C) |
| Example | 1.3 | 0.6 | 0.78 | 0.96 | 0.8 | 18.0 |
| Comparative Example 1 | 18 | 50 | 900 | 0.96 | 934.7 | 18.5 |
| | 18 | 50 | 900 | 2.03 | 444.4 | 21.6 |
| | 18 | 50 | 900 | 3.27 | 275.5 | 24.0 |
| | 18 | 50 | 900 | 5.93 | 151.7 | 30.5 |
| | 18 | 50 | 900 | 8.65 | 104.0 | 35.0 |
| | 18 | 50 | 900 | 14.73 | 61.1 | 46.4 |
| | 18 | 50 | 900 | 24.75 | 36.4 | 62.9 |
| | 18 | 50 | 900 | 39.41 | 22.8 | 72.8 |
| Comparative Example 2 | 18 | 50 | 900 | 0.96 | 940.2 | 17.6 |
| | 18 | 50 | 900 | 2.00 | 449.7 | 17.8 |
| | 18 | 50 | 900 | 3.20 | 281.7 | 18.7 |
| | 18 | 50 | 900 | 8.69 | 103.6 | 21.3 |
| | 18 | 50 | 900 | 14.94 | 60.2 | 23.9 |
| | 18 | 50 | 900 | 25.10 | 35.9 | 28.7 |
| | 18 | 50 | 900 | 40.76 | 22.1 | 36.1 |

LIGHT-EMITTING DEVICE AND METHOD OF MANUFACTURING THE SAME

The present application is based on Japanese Patent Application No. 2009-040765 filed on Feb. 24, 2009, the entire contents of which are incorporated herein by reference.

BACKGROUND OF THE INVENTION

1. Field of the Invention

The invention relates to a light-emitting device having a heat dissipating member formed of aluminum, aluminum alloy, magnesium or magnesium alloy, and to a method of manufacturing the same.

2. Related Art

As this type of device, a light-emitting device is known which includes a high thermal conductive heat dissipating base having a mounting surface for die bonding, a circuit substrate placed on the heat dissipating base and having a hole exposing a portion of the mounting surface and a stretching portion which stretches outward from an outer peripheral edge of the heat dissipating base, a light-emitting element mounted on the mounting surface through the hole, and a translucent resin body for sealing an upper side of the light-emitting element (e.g., see JP-A 2006-5290). In the light-emitting device of the JP-A 2006-5290, the heat dissipating base is placed in contact with an outer surface of a housing of an electronic device.

However, when the housing is formed of aluminum, aluminum alloy, magnesium or magnesium alloy, the light-emitting device of the JP-A 2006-5290 cannot be directly bonded by a typical solder material since an oxide film is formed on a surface of the housing. Therefore, it is necessary to include an adhesive sheet formed of a resin having adhesiveness between the heat dissipating base and the housing or to fix the heat dissipating base to the housing by a fastener member such as screw, hence, the number of components and the number of manufacturing processes increase. In addition, since the oxide film formed on the surface of the housing increases thermal resistance between the heat dissipating base and the housing, heat dissipation efficiency is deteriorated.

THE SUMMARY OF THE INVENTION

The invention is made in view of the above-mentioned circumstances, and it is an object of the invention to provide a light-emitting device and a method of manufacturing the same, in which it is possible to improve heat dissipation efficiency without increasing the number of components and the number of manufacturing processes even when a heat dissipating member formed of aluminum, aluminum alloy, magnesium or magnesium alloy is used.

According to one embodiment of the invention, a light-emitting device, comprises:

a light emitting portion comprising a substrate having a mounting surface for mounting a LED element and a metal portion formed on a surface of the substrate opposite to the mounting surface, the substrate comprising ceramic or a semiconductor and the metal portion being bondable to a solder material; and a heat dissipating member comprising aluminum, aluminum alloy, magnesium or magnesium alloy, and having, on a surface thereof, a junction treated so as to be bondable to the solder material and a heat dissipating film formed in a periphery of the junction, wherein the metal portion of the light emitting portion is bonded to the junction of the heat dissipating member by the solder material.

In the above embodiment, the solder material may be a material that is not possible to directly bond to the heat dissipating member.

In the above embodiment, the heat dissipating member may have a plate-like main body;

the light emitting portion may be mounted on an end surface of the main body of the heat dissipating member; and a product of a difference between a rate of thermal expansion of the heat dissipating member and that of the substrate of the light emitting portion and a longitudinal length of the end surface of the light emitting portion in the metal portion may be 0.2 μm/° C. or less.

In the above embodiment, the heat dissipating member may comprise a reflector portion continuously formed from the main body so as to cover the light emitting portion on both sides in a width direction of the end surface for reflecting light emitted from the light emitting portion.

In the above embodiment, a value of a dimension derived by dividing the metal portion of the light emitting portion by input power to the light emitting portion may be 500 mm$^2$/W or less.

In the above embodiment, the light emitting portion may comprise a glass sealing portion for sealing the LED element.

In the above embodiment, a plurality of the light emitting portions may be arranged in a row for forming a linear light source.

In the above embodiment, the junction may be any of Zn plating, V-plating and Cu plating.

According to another embodiment of the invention, a method of manufacturing the light-emitting device, comprises:

forming the heat dissipating film on a surface of the heat dissipating member in a state that the junction of the heat dissipating member is covered with a masking member; and after exposing the junction by removing the masking member, treating the junction so as to be bondable to the solder material.

In the above embodiment, the heat dissipating film may be formed by alumite treatment.

Points of the Invention

According to embodiments of the invention, it is possible to improve heat dissipation efficiency without increasing the number of components and the number of manufacturing processes even when a heat dissipating member formed of aluminum, aluminum alloy, magnesium or magnesium alloy is used.

BRIEF DESCRIPTION OF THE DRAWINGS

Next, the present invention will be explained in more detail in conjunction with appended drawings, wherein:

FIG. 5 is a table showing experimental result data of Example and Comparative Examples 1 and 2;

DESCRIPTION OF THE PREFERRED EMBODIMENTS to FIGS. 1 to 4 show the first embodiment of the invention. FIG. 1 is an outline perspective view of a light-emitting device.

As shown in FIG. 1, a light-emitting device 1 is provided with plural light emitting portions 2 including LED elements 21, a heat dissipating member 4 connected to each light emitting portion 2 via a solder material 3 (not shown in FIG. 1), and a flexible substrate 5 for supplying power to each light emitting portion 2. The heat dissipating member 4 is formed of aluminum, and a main body 41 is formed in a plate-like shape. Each light emitting portion 2 is mounted on an upper end surface of the main body 41 of the heat dissipating member 4 at intervals. Since the heat dissipating member 4 is aluminum in which an oxide film is likely to be formed on a surface thereof, it is not possible to directly bond to the solder material 3. However, a junction 43 (not shown in FIG. 1) which is bondable to the solder material 3 is formed by performing a predetermined treatment on the heat dissipating member 4.

FIG. 2 is a schematic side cross-sectional view of the light-emitting device.

As shown in FIG. 2, there are plural light emitting portions 2 which are arranged in a row for forming a linear light source. In the present embodiment, eight light emitting portions 2 in total are mounted electrically in series on the flexible substrate 5. Each light emitting portion 2 has three LED elements 21 each connected electrically in series. Each LED element 21 emits light with a peak wavelength of 460 nm when a forward voltage is 4.0V and a forward current is 100 mA. In the light-emitting device 1, since twenty-four LED elements 21 in total are connected in series, when a domestic power supply of AC 100V is used, forward voltage of about 4.0V is applied to each LED element 21 for operating each LED element 21 as desired.

Figure 1:
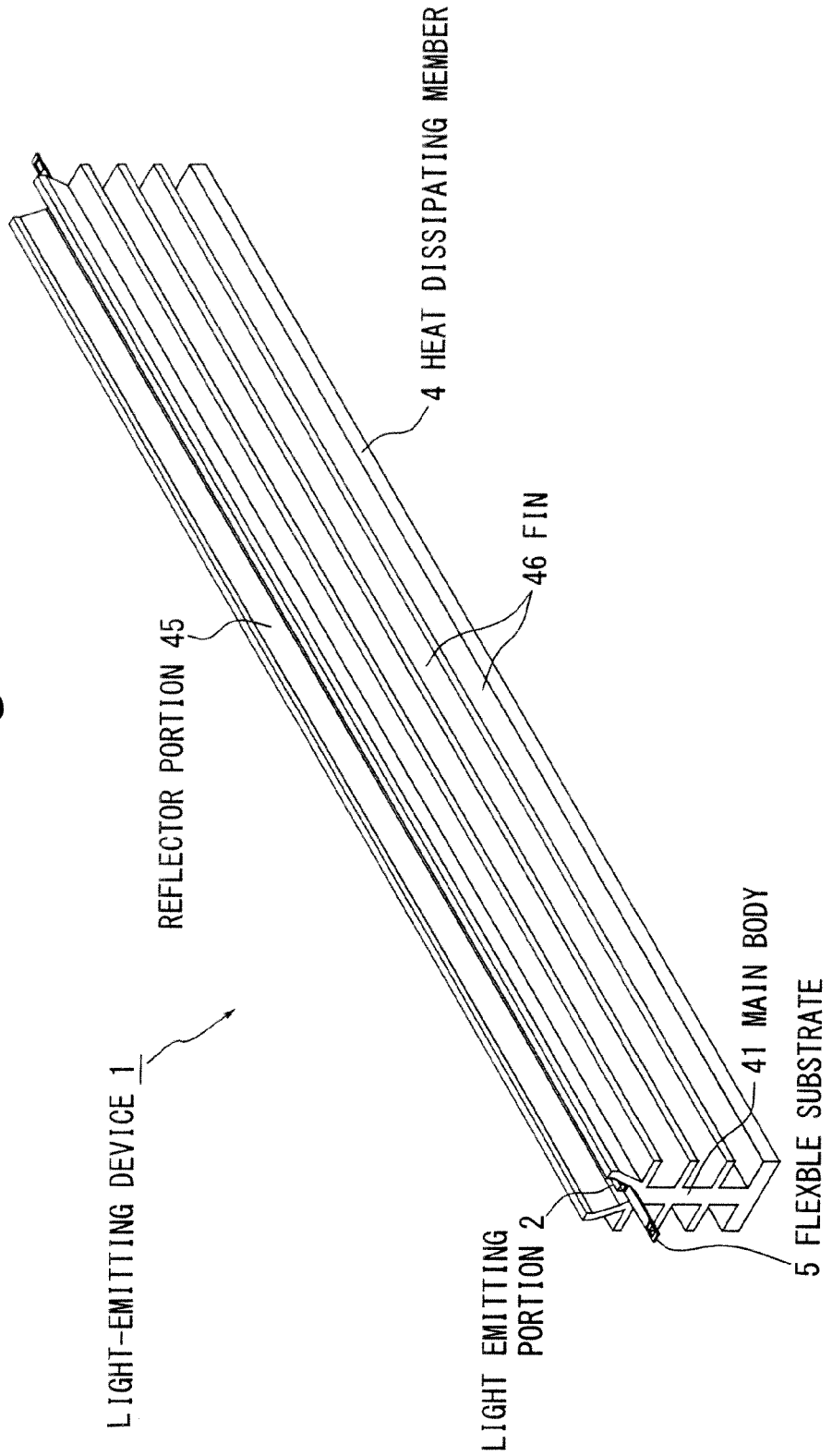
FIG. 1 is an outline perspective view showing a light-emitting device in a first preferred embodiment of the present invention.
Figure 2:
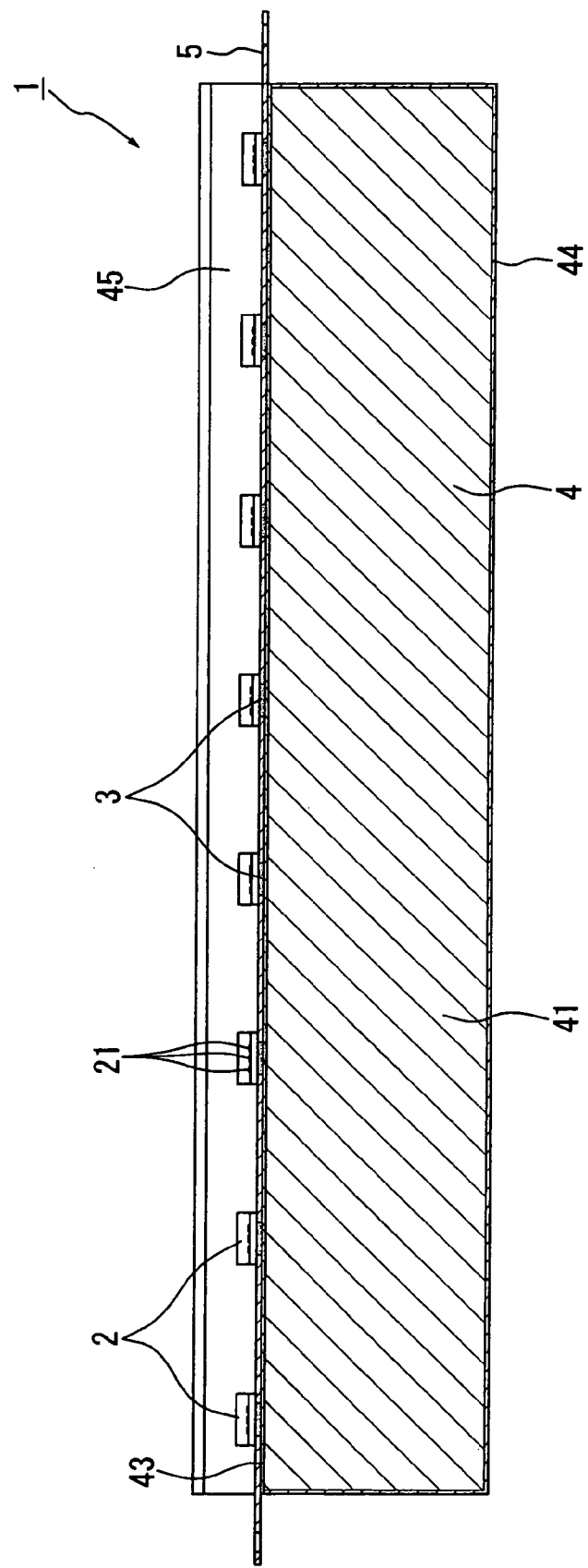
FIG. 2 is a schematic side cross-sectional view showing the light-emitting device.

The junction 43 formed of Zn plating is formed on the upper end surface of the main body 41 of the heat dissipating member 4. In the present embodiment, the Zn plating is formed on the entire upper end surface of the main body 41. The plural light emitting portions 2 are each mounted on the junction 43 at equal intervals via the solder material 3. The Zn plating layer is formed by zincate treatment which replaces Al of the main body 41 with Zn. In the present embodiment, a Ni plating layer and an Au plating layer are formed on the Zn plating layer in this order. Here, V may be used instead of using Zn for replacing Al of the main body 41 with V.

In the heat dissipating member 4, a heat dissipating film 44 is formed on the entire surface except on the junction 43. The heat dissipating film 44 is an aluminum oxide coating, and is formed by alumite treatment.

Figure 3:
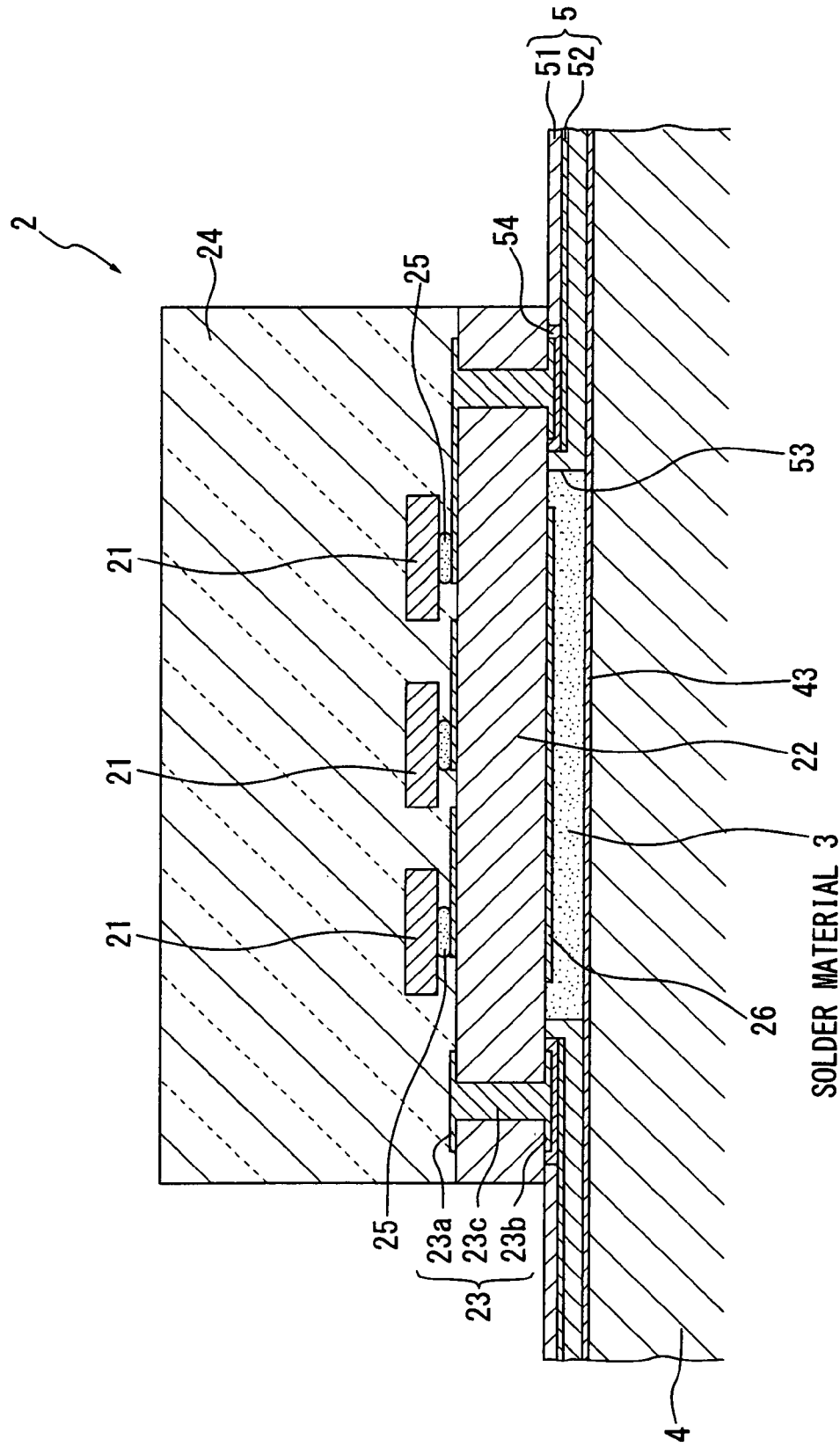
FIG. 3 is an enlarged cross-sectional schematic diagram showing the vicinity of a light emitting portion of the light-emitting device.

FIG. 3 is an enlarged cross-sectional schematic diagram showing the vicinity of a light emitting portion of the light-emitting device.

As shown in FIG. 3, the light emitting portion 2 is provided with plural flip-chip-type LED elements 21, a mounting substrate 22 formed of ceramic for mounting each LED element 21, a circuit pattern 23 formed in the mounting substrate 22 for supplying power to each LED element 21, a glass sealing portion 24 for sealing each LED element 21 on the mounting substrate 22, and bumps 25 intermediate between each LED element 21 and the circuit pattern 23.

The LED element 21 is formed of a semiconductor represented by a formula of, e.g., $In_xAl_yGa_{1-x-y}N(0 \leq x \leq 1, 0 \leq y \leq 1, 0 \leq x+y \leq 1)$, and emits blue light. The semiconductor of the LED element 21 is arbitrary, and for example, other semiconductor materials such as AlGaAs-based material or GaAsP-based material may be used.

The mounting substrate 22 is formed of a polycrystalline sintered material of alumina ($Al_2O_3$), and the circuit pattern 23 has an upper surface pattern 23a which is formed on an upper surface of the mounting substrate 22 and is electrically connected to each LED element 21, an electrode pattern 23b which is formed on a lower surface of the mounting substrate 22 and is electrically connected to the flexible substrate 5, and a via pattern 23c for electrically connecting the upper surface pattern 23a to the electrode pattern 23b. In addition, a heat dissipation pattern 26 is formed on the lower surface of the mounting substrate 22 between each electrode pattern 23b. In other words, the heat dissipation pattern 26 is a metal portion bondable to the solder material 3, and is metalized with the mounting substrate 22 as an insulating portion formed of ceramic. Alternatively, ceramic other than AlN or a semiconductor material such as silicon may be used for the mounting substrate 22. Silicon has a thermal conductivity of 100 W/m·K or more and is cheap as compared with AlN.

The glass sealing portion 24 is formed of $ZnO-B_2O_3-SiO_2-Nb_2O_5-Na_2O-Li_2O$-based thermal fusion glass, and is formed in a rectangular parallelepiped shape on the mounting substrate 22. The thermal fusion glass has a glass transition temperature (Tg) of 490° C., a yielding point (At) of 520° C., a rate of thermal expansion ($\alpha$) of $6 \times 10^{-6}/°$ C. at 100-300° C. and a refractive index of 1.7. The glass composition is not limited thereto, and for example, the he thermal fusion glass may not contain $Li_2O$ or may contain $ZrO_2$ or $TiO_2$, etc., as an arbitrary component. Moreover, the glass sealing portion 24 may be sol-gel glass of which starting material is metal alkoxide. Furthermore, the LED element 21 may be sealed by, e.g., a resin material such as silicone.

The flexible substrate 5 has an insulating portion 51 formed of, e.g., polyimide or liquid crystal polymer, etc., and a circuit pattern 52 formed in the insulating portion 51. The circuit pattern 52 of the flexible substrate 5 is exposed from the insulating portion 51 at a connecting portion with the light emitting portion 2, and is connected to the circuit pattern 23 of the light emitting portion 2 via a soldering material 54. In addition, a hole 53 penetrating a projecting portion 42 of the heat dissipating member 4 is formed in the flexible substrate 5, and the solder material 3 is filled therein. The connecting portion of the flexible substrate 5 with the light emitting portion 2 is not bound by the heat dissipating member 4 in order to prevent generation of poor electrical connection due to thermal stress.

It is possible to select an arbitrary material for the solder material 3, and for example, it is possible to use Sn—Sb-based solder, Sn—Cu-based solder, Sn—Ag-based solder, Sn—Zn-based solder and Sn—Bi-based solder, etc. In the present embodiment, the thickness of the solder material 3 is about 20-100 μm. A solder material bondable to aluminum includes Sn—Pb-based solder and Zn—Cd—Bi-based solder, etc., however, there is a problem that these solders are likely to be oxidized, galvanic corrosion is likely to occur and the thermal expansion coefficient is large. A typical solder material, which is relatively easy to solder and has high workability, is used in the present embodiment without using such a specific solder material directly bondable to aluminum.

Figure 4:
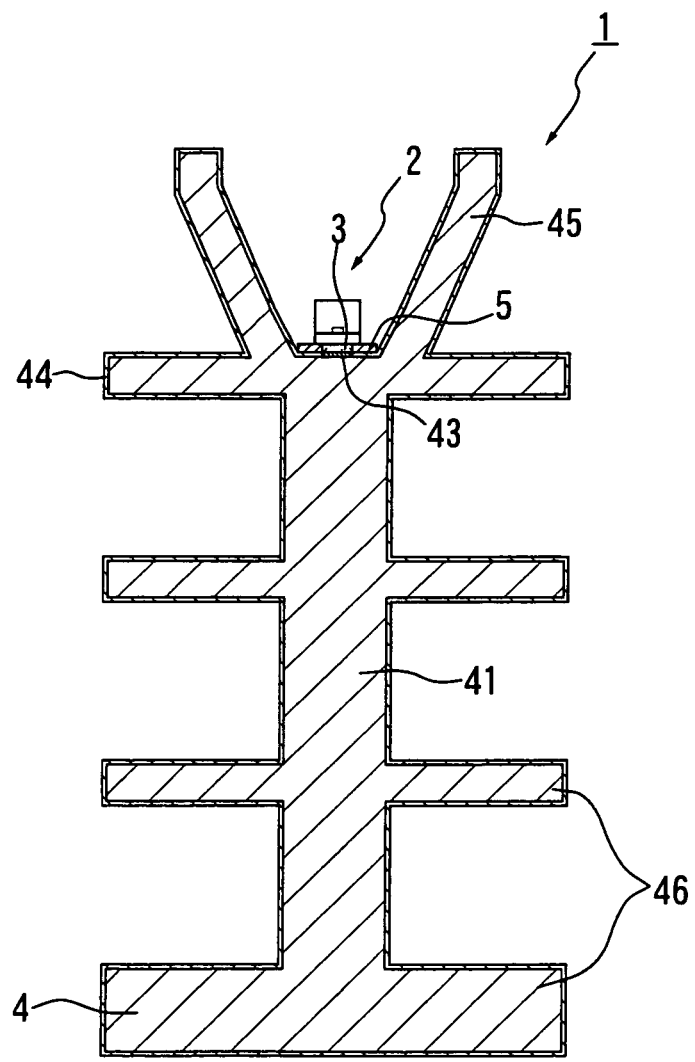
FIG. 4 is a schematic front cross-sectional view showing the light-emitting device.

FIG. 4 is a schematic front cross-sectional view showing the light-emitting device.

As shown in FIG. 4, the heat dissipating member 4 has a reflector portion 45 integrally formed with the main body 41 and plural fins 46. The reflector portion 45 is continuously formed from an upper end of the main body 41, covers the light emitting portion 2 from both sides in a width direction of the upper end surface of the main body 41, and has a concave shape opening upward. Each fin 46 is continuously formed from right and left principal surfaces of the main body 41, and is formed so as to extend toward outside in a width direction. The reflector portion 45 and the fin 46 extend in an arrangement direction of the light emitting portions 2, and are formed having the same cross section throughout the longitudinal direction of the device.

A method of manufacturing the light-emitting device 1 will be explained.

Firstly, the heat dissipating member 4, in which the junction 43 or the heat dissipating film 44 are not formed yet, is formed by aluminum extrusion. Then, oil or dust on a surface of the heat dissipating member 4 is removed by performing degreasing treatment on the heat dissipating member 4.

Next, a masking tape as a masking material is attached on the upper end surface of the heat dissipating member 4. The masking member is not limited to the masking tape, and for example, a jig or a resist material, etc., may be used.

Next, the alumite treatment is applied to the heat dissipating member 4 by positively oxidizing the heat dissipating member 4 in an oxalic acid solution. As a result, the heat dissipating film 44 is formed on the heat dissipating member 4.

After this, the masking tape is removed from the heat dissipating member 4, the heat dissipating member 4 is immersed in a zincate solution for dissolving Al, and Zn at the same molar concentration as the dissolved Al is replaced and precipitated. As a result, the Zn plating layer is formed on the upper end surface of the main body 41. The thickness of the Zn plating layer is arbitrary, and it can be about several 100 Å, e.g., 200-300 Å. The Ni plating layer and the Au plating layer are further formed on the Zn plating layer. The thickness of the Ni plating layer is arbitrary, and it is, e.g., 5 μm. In addition, the thickness of the Au plating layer is arbitrary, and it is, e.g., 0.05 μm. The to junction 43 is formed as described above.

It should be noted that, although both of acid and alkali systems can be used as a zincate solution, an acid system zincate solution is preferable for a film treated by alumite since, when using the acid system, the film treated by alumite is less damaged and the treatment time of the Zn plating or flexibility of the plating formation increases. The acid system zincate solution includes, e.g., ($ZnSO_4$, $NH_4Cl$, $Al_2(SO_4)_3 \cdot 8H_2O$, $CH_3COONa \cdot 3H_2O$).

On the other hand, each light emitting portion 2 is mounted on the flexible substrate 5 using the solder material 54. Here, the solder material 3 has been applied on the heat dissipation pattern 26 of each light emitting portion 2. Then, the heat dissipation pattern 26 of each light emitting portion 2 is bonded to the junction 43 of the heat dissipating member 4 by the solder material 3, thereby completing the light-emitting device 1.

According to the light-emitting device 1 configured as mentioned above, since the junction 43 treated so as to be bondable to the solder material 3 is formed on the heat dissipating member 4 formed of aluminum which is difficult to bond to the solder material 3, it is possible to bond the light emitting portion 2 to the heat dissipating member 4 via the solder material 3. As a result, the fastener member such as screw or an adhesive resin sheet, etc., is not necessary and the number of components as well as the number of manufacturing processes decrease, and it is thereby possible to reduce the cost.

Meanwhile, there is a conventional problem that, when copper which is easy to bond to a solder material is used for the heat dissipating member, the specific gravity is large and the weight of the device increases. Moreover, there is also a problem that the material cost per weight is high and it is difficult to carry out the extrusion or the die cast mold, which leads to deterioration of processability. The light-emitting device 1 in the present embodiment solves these problems.

In addition, the heat generated by each LED element 21 during the use is smoothly transmitted to the heat dissipating member 4 through the mounting substrate 22 and the solder material 3. For example, in case of fastening the heat dissipating base formed of copper to the housing formed of aluminum by a screw, the contact portion of the above two does not fully contact in a micro view, furthermore, contact thermal resistance due to the surface oxide film exists at a position where the above two are in contact. However, in the present embodiment, since the junction 43 of the heat dissipating member 4 fully contacts with the main body 41 even in a micro view and the oxide film is not formed between the above two, it is possible to strengthen the bonding of the solder material 3 to the heat dissipating member 4 and to reduce the thermal resistance between the mounting substrate 22 and the main body 41, hence, it is highly advantageous in practical use. Therefore, even if heat is generated by each LED element 21, it is possible to maintain the state that the light emitting portion 2 is tightly bonded to the heat dissipating member 4 via the solder material 3, and it is thereby possible to ensure high reliability without separation of the light emitting portion 2 from the heat dissipating member 4 during the use and without an over-time increase in the thermal resistance between the light emitting portion 2 and the heat dissipating member 4.

FIG. 5 is a table showing experimental result data of Example and Comparative Examples 1 and 2.

In Example, three light emitting portions 2 mounting twenty-four LED elements 21 were connected to the junction 43 of the heat dissipating member 4 by the solder material 3. The main body 41 of the heat dissipating member 4 has a dimension of 100 mm in a longitudinal direction, 10 mm in a width direction and 20 mm in a vertical direction, and fins 46 having a dimension of 100 mm in a longitudinal direction, 3.75 mm in a width direction and 1.00 mm in a vertical direction were formed in three pairs in a width direction at a vertical interval of 4.5 mm. The contact area of the solder material 3 with the heat dissipating member 4 was 0.78 mm$^2$, derived by 1.3 mm in a longitudinal direction of the light emitting portion 2 and 0.6 mm in a width direction thereof. FIG. 5 shows the total amount of power input into each light emitting portion 2 and a temperature difference between the light emitting portion 2 and the fin 46.

Meanwhile, three light emitting portions 2 were used in the same manner as the Example, each light emitting portion 2 was connected to a copper slag by the solder material 3 and the copper slag was fastened with the heat dissipating member 4 by a screw, thereby manufacturing the Comparative Example 1. In detail, the contact area of the copper slag with the heat dissipating member 4 was 900 mm$^2$, derived by 18 mm in a longitudinal direction of the light emitting portion 2 and 50 mm in a width direction thereof. Here, the same heat dissipating member 4 as the Example was used. FIG. 5 shows the total amount of power input into each light emitting portion 2 and a temperature difference between the light emitting portion 2 and the fin 46 in Comparative Example 1.

In addition, Comparative Example 2 was manufactured by applying a heat dissipating grease between the copper slag of the Comparative Example 1 and the heat dissipating member 4. FIG. 5 shows the total amount of power input into each light emitting portion 2 and a temperature difference between the light emitting portion 2 and the fin 46 in Comparative Example 2. Here, light emitting energy efficiency of the light emitting portion 2 is 20-30% and a calorific value is derived by subtracting the portion converted into the light from the input power.

Figure 6:
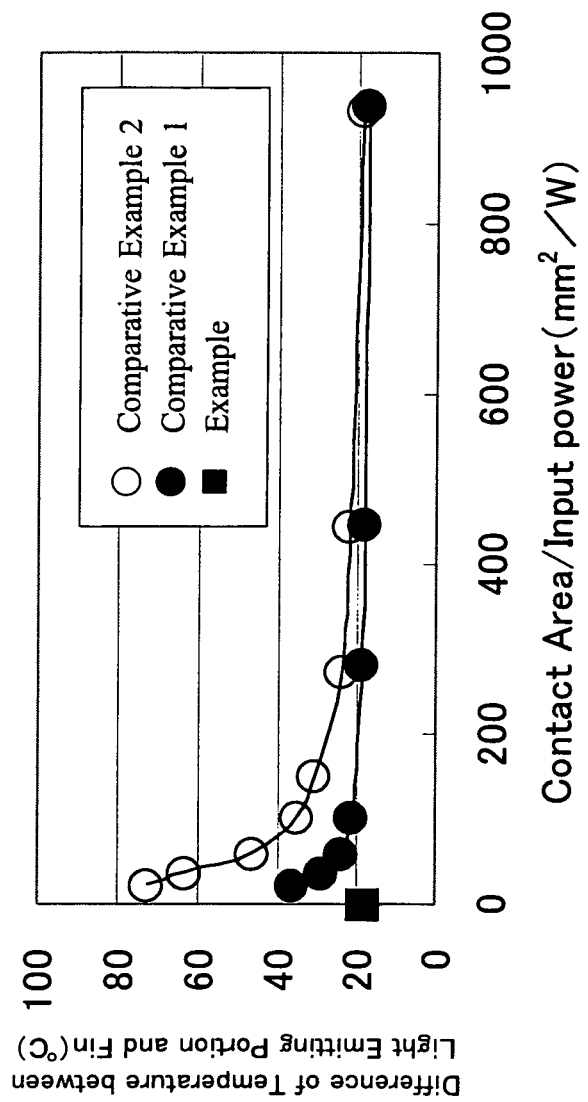
FIG. 6 is a graph comparing Example and Comparative Examples 1 and 2, wherein a horizontal axis is a value derived by dividing a contact area by input power and a vertical axis is a difference of temperature between the light emitting portion and a fin.

FIG. 6 is a graph comparing Example and Comparative Examples 1 and 2, wherein a horizontal axis is a value derived by dividing a contact area by input power and a vertical axis is a difference of temperature between the light emitting portion and the fin.

As understood from the graph of Comparative Example 1 in FIG. 6, if the contact area per input power is large enough, it is possible to suppress a temperature increase of the fin 46 even being fastened by a screw. However, in Comparative Example 1, the contact area per input power is small and the temperature difference between the light emitting portion 2 and the fin 46 is increased at about 500 mm$^2$/W or less. In other words, the heat generated in the light emitting portion 2 is less likely to be transmitted to the fin 46 when the contact area per input power is decreased. As understood from the graph of Comparative Example 2 in FIG. 6, even though the heat dissipating grease is applied to the contact portion, the heat generated in the light emitting portion 2 is less likely to be transmitted to the fin 46 at 100 mm$^2$/W or less.

In contrast to this, in Example, the heat generated in the light emitting portion 2 is transmitted to the fin 46 even when the contact area per input power is about 1.0 mm$^2$/W. As described above, it is possible to prevent generation of the thermal resistance at a junction of the members by directly bonding the solder material 3 to the junction 43 of the heat dissipating member 4. In Example, the effect is remarkable at 500 mm$^2$/W or less comparing with Comparative Example 1, and the effect is also remarkable at 100 mm$^2$/W or less comparing with Comparative Example 2 in which the heat dissipating grease is used.

Here, when the reflector portion 45 which covers the light emitting portion 2 from the outside is present in the heat dissipating member 4 similarly to the present embodiment, the contact area of the light emitting portion 2 with the heat dissipating member 4 is relatively small and it is likely to be affected by the thermal resistance at the junction of the light emitting portion 2 with the heat dissipating member 4. However, the temperature increase due to the thermal resistance is not observed since the light emitting portion 2 is mounted on the junction 43 via the solder material 3.

On the other hand, a solder crack due to heat stress is likely to be generated in the light-emitting device 1 in which ceramic is used as the mounting substrate 22. When aluminum is used as the heat dissipating member 4 similarly to the present embodiment, the rate of thermal expansion of the heat dissipating member 4 becomes larger than that of copper and a difference of the rate of thermal expansion between the mounting substrate 22 and the heat dissipating member 4 becomes larger as compared with the configuration for bonding to the copper. However, from the experiments by the inventors, it has been confirmed that the solder crack is prevented when a product of (difference of rate of thermal expansion between the heat dissipating member 4 and the mounting substrate 22 of the light emitting portion 2) and (longitudinal length of upper end surface of the main body 41 in the heat dissipation pattern 26 of the light emitting portion 2) is 0.2 μm/° C. or less. Here, the Sn—Ag—Cu solder was used as the solder material 3. More preferably, the value is 0.09 μm/° C. or less. The value is 0.2 μm/° C. in the present embodiment. In detail, when the rate of thermal expansion of the heat dissipating member 4 is 23×10$^{-6}$/° C., the rate of thermal expansion of the mounting substrate 22 is 7×10$^{-6}$/° C. and the longitudinal length of the heat dissipation pattern 26 is 12.8 mm, the product of (difference of rate of thermal to expansion between the heat dissipating member 4 and the mounting substrate 22 of the light emitting portion 2) and (longitudinal length of the heat dissipation pattern 26 of the light emitting portion 2) was 0.2048 μm/° C., and the crack did not occur in a 1000-cycle thermal shock test of −40° C. to 100° C. and did occur in a 3000-cycle. The crack did not occur even in a 3000-cycle when the longitudinal length of the heat dissipation pattern 26 was 5.6 mm and 1.3 mm.

Figure 7:
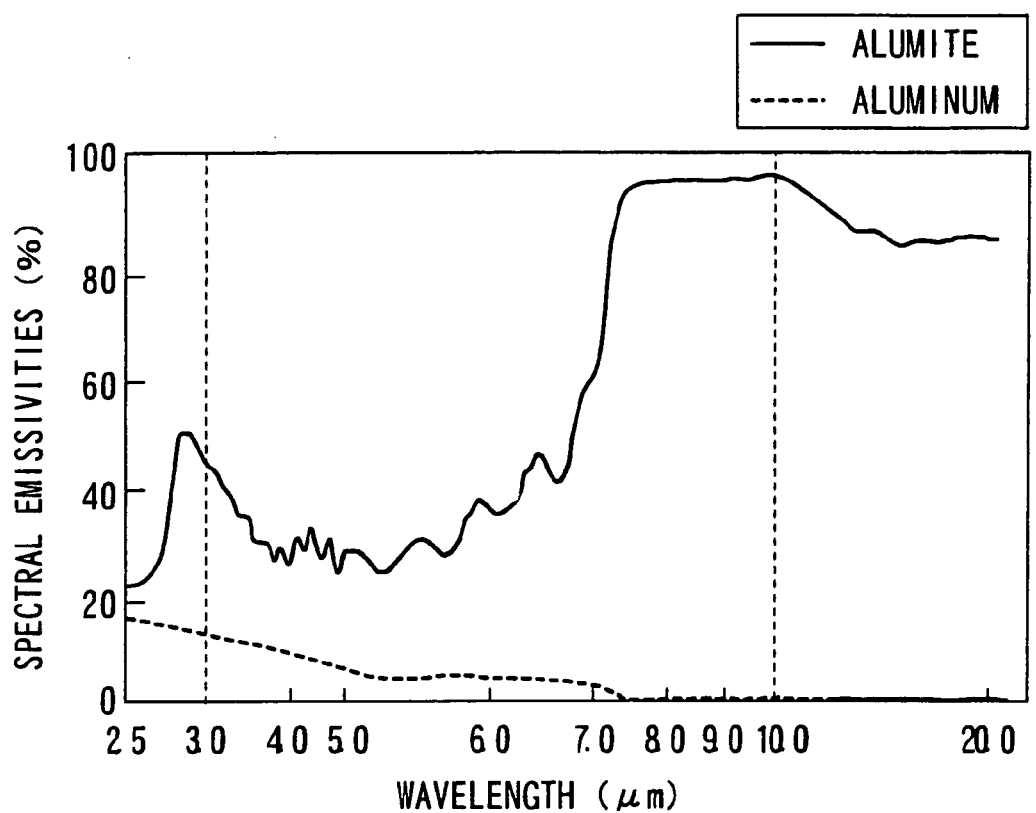
FIG. 7 is a graph showing spectral emissivities of aluminum and alumite.

In addition, according to the light-emitting device 1 of the present embodiment, since the surface of the heat dissipating member 4 is entirely covered by the heat dissipating film 44, heat dissipation performance is dramatically improved. FIG. 7 is a graph showing spectral emissivities of aluminum and alumite (oxide coating of aluminum). As shown in FIG. 7, the spectral emissivity of the aluminum is less than 10% of blackbody radiation in a wavelength range of, e.g., about 4 μm or more. On the other hand, by forming an alumite coating on a surface of the aluminum material, the spectral emissivity can be 80% or more of the black-body radiation especially in a range of 8-20 μm. Note that, as shown in FIG. 7, the alumite coating has spectral emissivity higher that of the aluminum in the all wavelength range, and it is possible to improve the spectral emissivity of the aluminum even in a range of less than 8 μm. In a range of less than 8 μm, it is possible to enhance heat dissipation by applying a coating having relatively high spectral emissivity, such as ceramic. This is effective when the a spectral peak of the spectral emissivity shifts on a short wavelength side when the temperature of the heat dissipating member 4 is high, and is desirable in a configuration in that the temperature of the heat dissipating member 4 is high, e.g., over 100° C. As the heat dissipating film 44, either the alumite coating or the ceramic coating can be formed, or alternatively, the both can be formed. In addition, since the heat dissipating film 44 is formed in a state that the junction 43 is masked, it is possible to simply and easily make the heat dissipating member 4.

In addition, according to the light-emitting device 1 of the present embodiment, the junction 43 not having the oxide film formed thereon can be relatively easily formed in a narrow space inside the reflector portion 45, and a compact light-focusing light source can be formed by approximating the light emitting portion 2 with the reflector portion 45. As described above, since the attachment to the heat dissipating member 4 is possible without having surface oxide film and without increasing the contact area, it is possible to bond the light emitting portion 2 in a low thermal resistance state without restricting the shape of the reflector portion 45. As a result, it is possible to use the heat dissipating member 4 in which the main body 41 is integrally formed with the reflector portion 45. Specifically, it is advantageous when a bottom portion of the reflector portion 45 is relatively narrowed by enlarging the opening of the reflector portion 45 with respect to the bottom portion.

In addition, according to the light-emitting device 1 of the present embodiment, by further forming the Ni plating layer and the Au plating layer on the Zn plating layer, a function of reducing the thermal stress of the junction 43 is improved and surface corrosion is effectively prevented. Note that, it is possible to bond to the solder material 3 without forming the Ni plating layer and the Au plating layer. Alternatively, plating by Cu, Sn, Ni or V, etc., may be used besides Zn. In addition, alumite of the heat dissipating film 44 is not limited to the typical alumite which has honeycomb like holes (porous), it may be alumite to which sealing is applied, or may be alumite of which resistance to a plate processing solution is improved such as hard alumite in which a dense film is formed at a low temperature or alumite in which a Teflon (registered trademark) coating is further formed on the alumite coating.

Alternatively, the heat dissipating film 44 may be a metal oxide coating formed by plasma oxidation treatment instead of using the alumite treatment. By this method, it is possible to suppress generation of holes in the coating, and since the degree of roughing the surface of the base material formed of aluminum is small, it is possible to maintain the high linear reflectance, thus, it is preferable to apply to the reflector portion 45.

In addition, although it is exemplarily shown that the alumite coating is formed after masking an upper end surface of the heat dissipating member 4 and partial plating is subsequently carried out on the upper end surface, it is not limited thereto. Hence, after forming the alumite coating on the whole heat dissipating member 4, the partial plating may be carried out after removing a portion of the alumite coating to be partially plated by to a cutting process. As described above, it is possible to reduce the plating material cost, especially the cost of Au, by partially plating the upper end surface of the heat dissipating member 4 in a state of being masked by the heat dissipating film 44.

Figure 8:
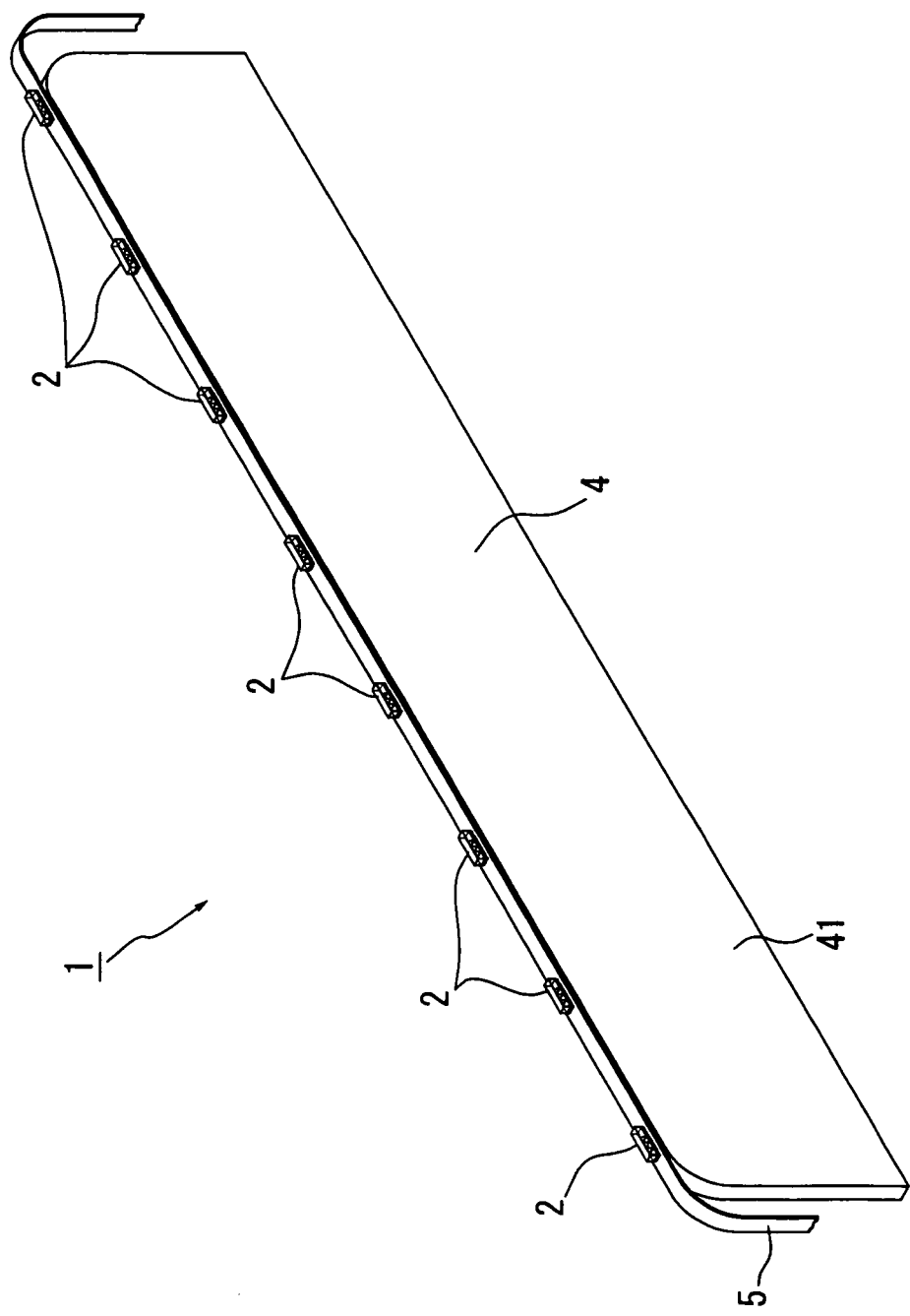
FIG. 8 is an outline perspective view showing a light-emitting device in a modification.
Figure 9:
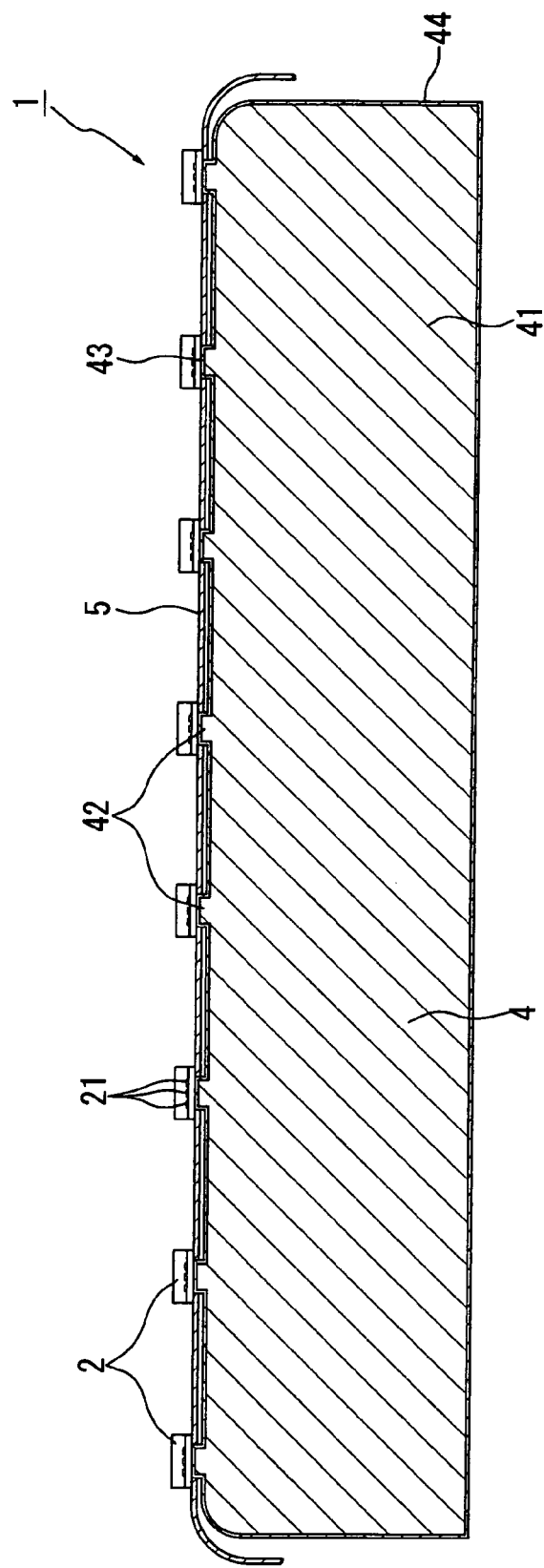
FIG. 9 is a schematic side cross-sectional view showing the light-emitting device in the modification.

FIGS. 8 and 9 show the modification of the first embodiment. FIG. 8 is an outline perspective view of the light-emitting device and FIG. 9 is a schematic side cross-sectional view of the light-emitting device.

Although it is shown that the reflector portion 45 and the fin 46 are formed in the above-mentioned embodiment, it may be configured such that the heat dissipating member 4 has only a plate-like main body 41 without providing the reflector portion 45 and the fin 46 as shown in FIGS. 8 and 9. As shown in FIG. 9, in this light-emitting device 1, the projecting portions 42 where each light emitting portion 2 is mounted on the upper end surface of the main body 41 are formed at predetermined intervals. Moreover, the shape may be such that one light emitting portion 2 is mounted on a tip of the rod-shaped heat dissipating member 4 and is surrounded by the reflector portion 45 except the upper side of the light emitting portion 2.

Figure 10:
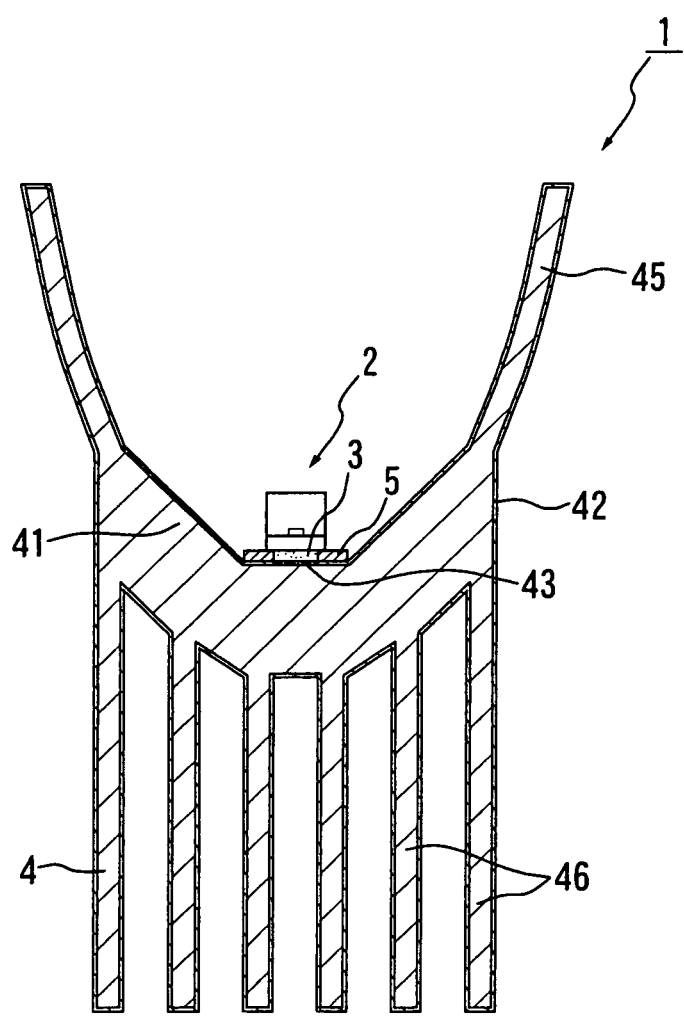
FIG. 10 is a schematic front cross-sectional view showing the light-emitting device in the modification.
Figure 11:
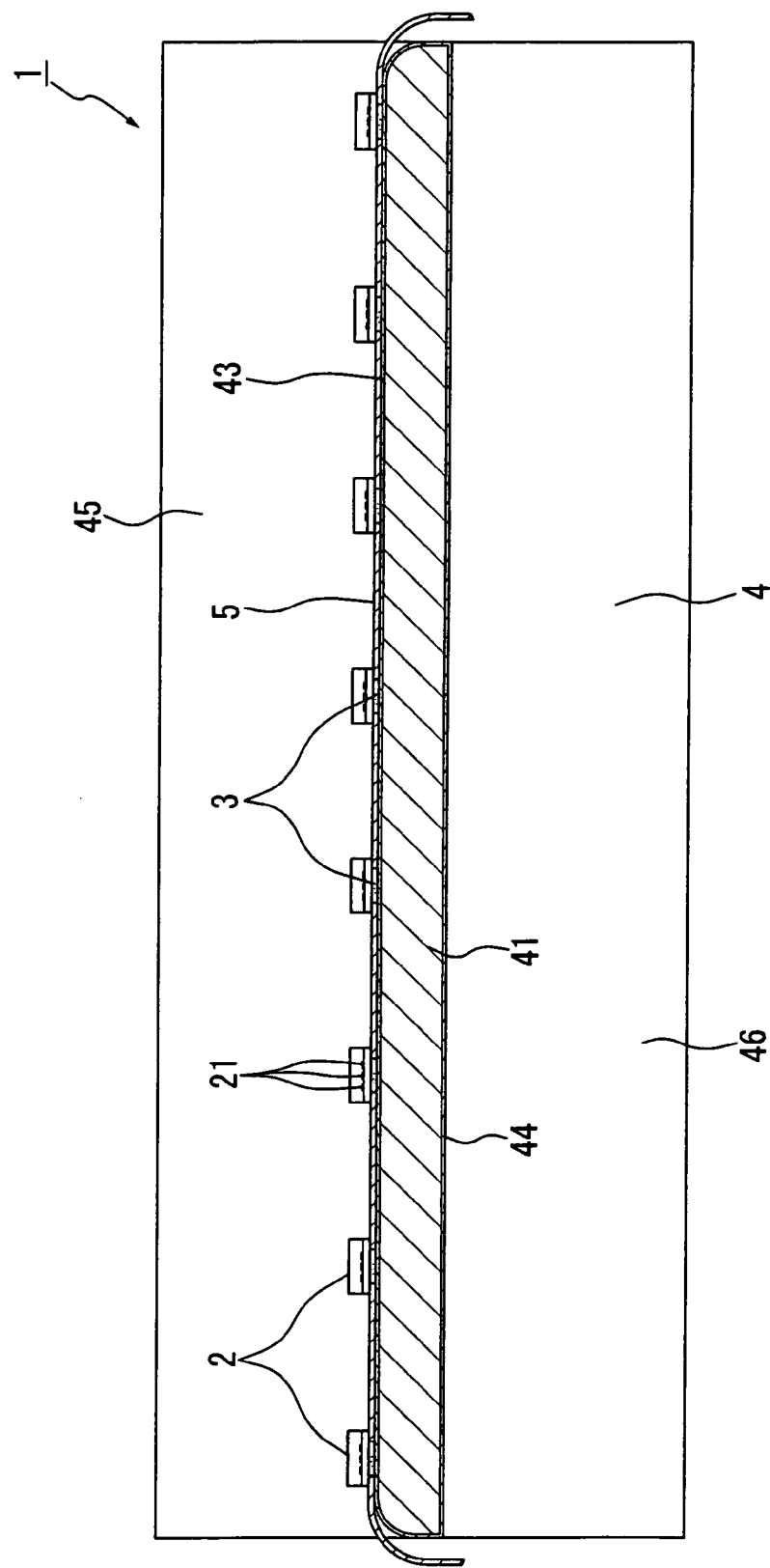
FIG. 11 is a schematic side cross-sectional view showing the light-emitting device in the modification.

FIGS. 10 and 11 show the modification of the first embodiment. FIG. 10 is a schematic front cross-sectional view of the light-emitting device and FIG. 11 is a schematic side cross-sectional view of the light-emitting device.

Although it is shown that each fin 46 of the heat dissipating member 4 extends in a horizontal direction in the above-mentioned embodiment, each fin 46 of the heat dissipating member 4 may extend downwardly as shown in FIGS. 10 and 11. In this light-emitting device 1, the main body 41 of the heat dissipating member 4 is formed in a concave shape so as to cover the light emitting portion 2 from outside of a width direction, and plural fins 46 are provided on a lower surface of the main body 41 at intervals in a width direction.

Figure 12:
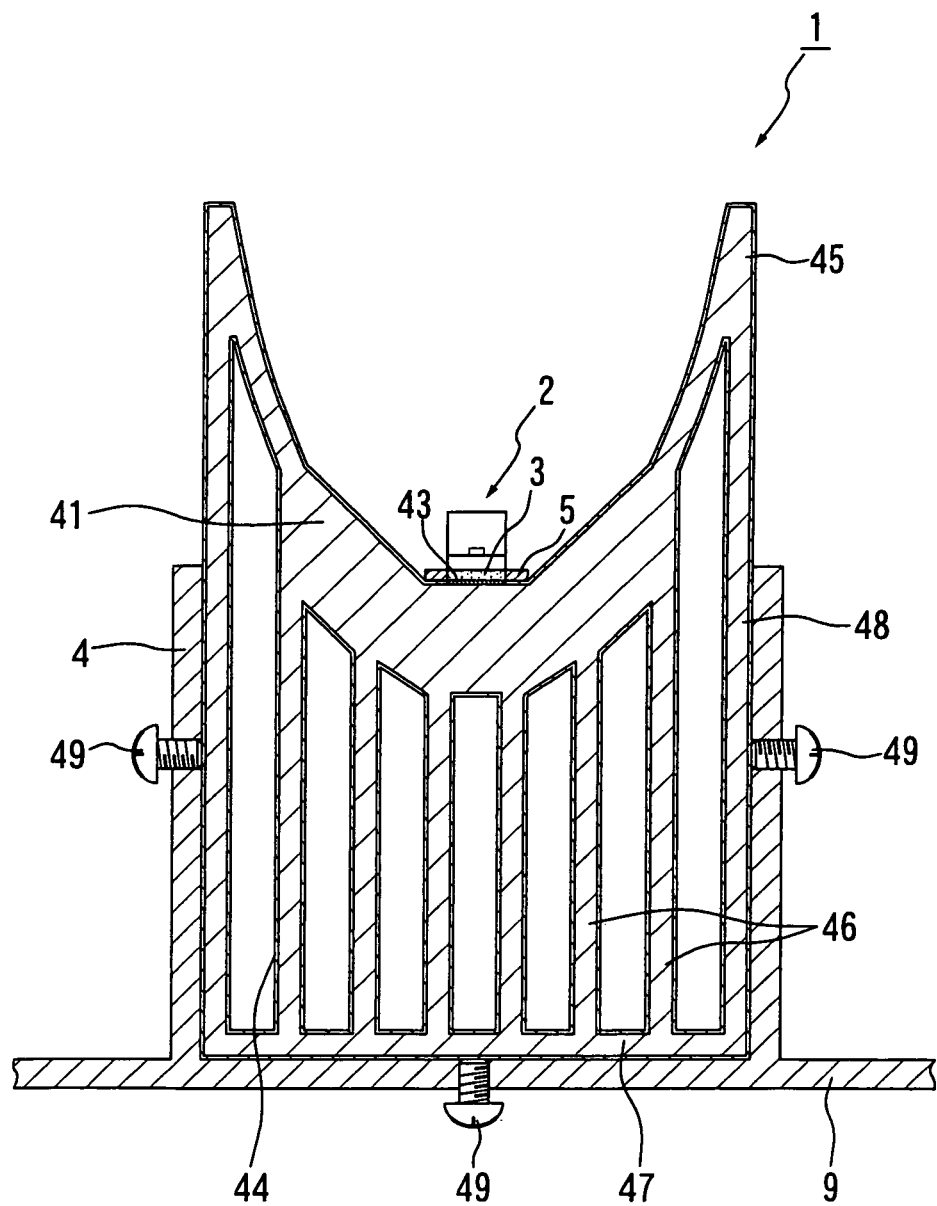
FIG. 12 is a schematic front cross-sectional view showing the light-emitting device in the modification.

FIG. 12 is a schematic front cross-sectional view showing the light-emitting device in the modification of the first embodiment.

Although it is shown that a gap between each fin 46 of the heat dissipating member 4 is opened at a lower end in the modification shown in FIGS. 10 and 11, for example, the lower end of each fin 46 may be connected to a plate portion 47 as shown in FIG. 12. In the light-emitting device 1 of FIG. 12, outer frame portions 48 downwardly extend from both width direction ends of the reflector portion 45, and each outer frame portion 48 is connected to the plate portion 47. An external heat dissipating member 9 is in surface contact with the outer frame portion 48 and the plate portion 47 by a screw 49. The external heat dissipating member 9 is preferable to be used as a backbone of a building or a vehicle to which the device is placed. For example, it may be a steel beam of a building when installed thereto, and it may be a body of a vehicle when installed thereto.

Figure 13:
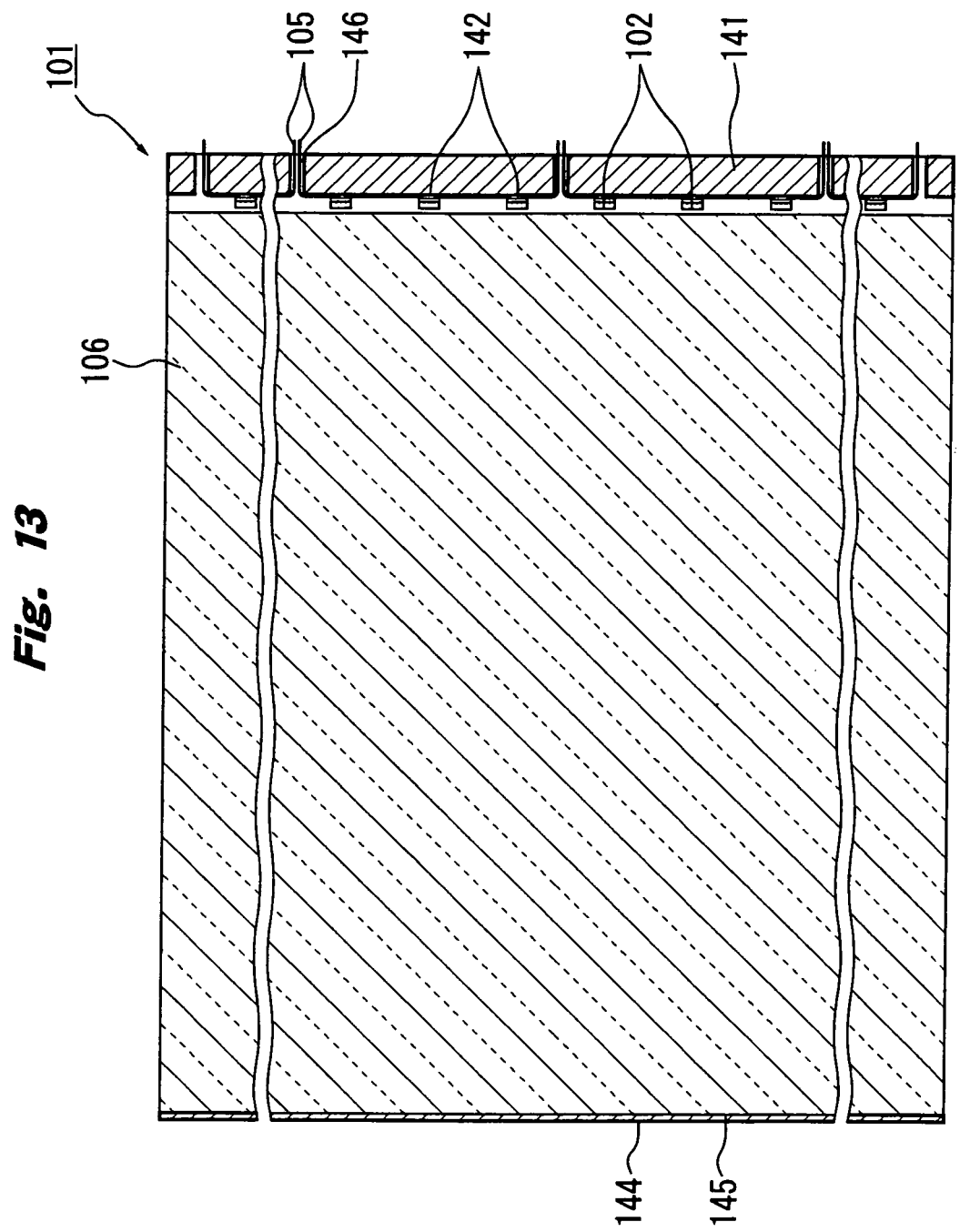
FIG. 13 is a lateral cross-sectional schematic diagram showing a light-emitting device in a second embodiment of the invention.
Figure 14:
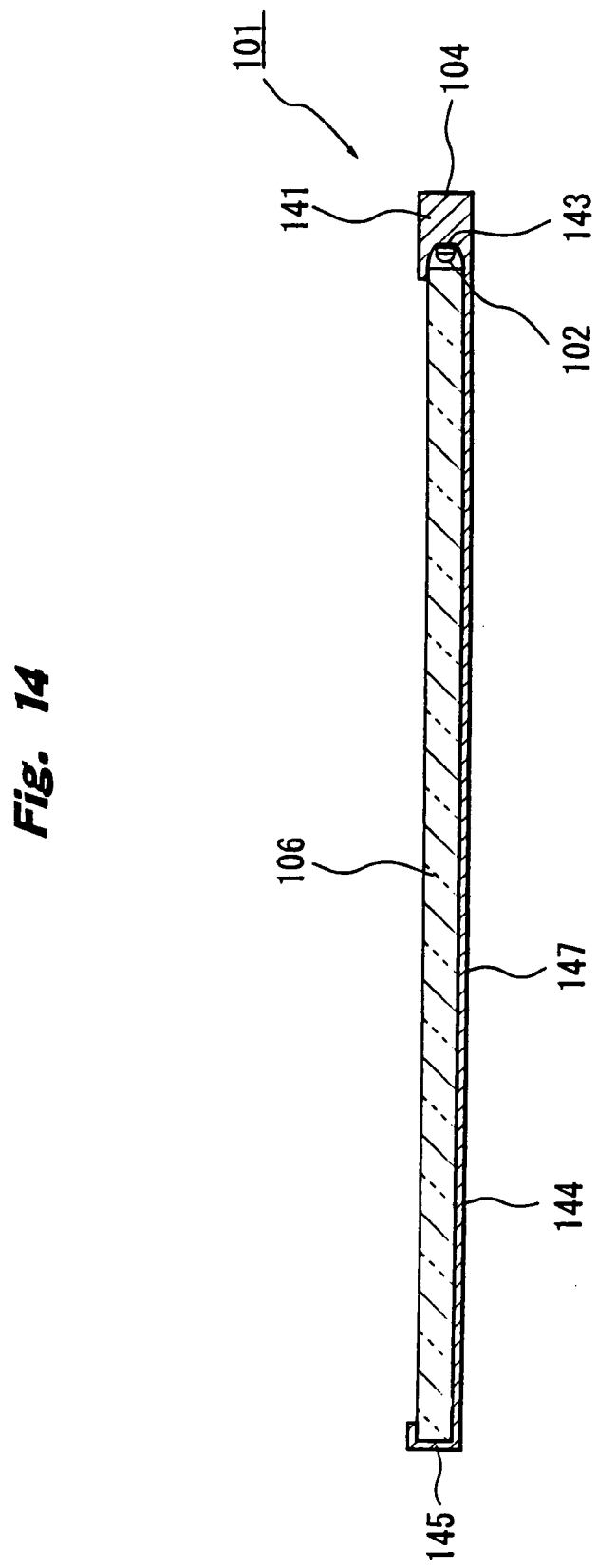
FIG. 14 is a vertical cross sectional view showing a light-emitting device.
Figure 15:
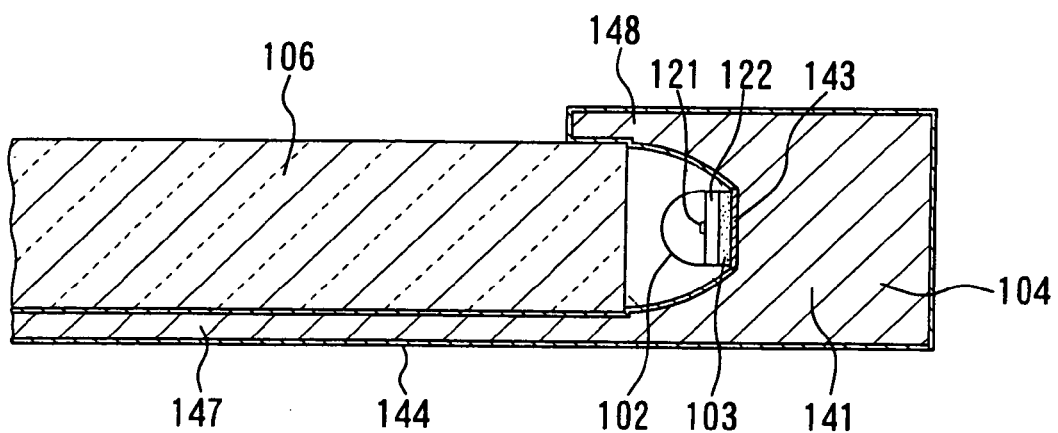
FIG. 15 is an enlarged vertical cross sectional view showing a light-emitting device.

FIGS. 13 to 15 show the second embodiment of the invention, and FIG. 13 is a lateral cross-sectional schematic diagram of the light-emitting device.

As shown in FIG. 13, a light-emitting device 101 is provided with plural light emitting portions 102 including LED elements 121, a heat dissipating member 104 connected to each light emitting portion 102 via a solder material 103, and a flexible substrate 105 for supplying power to each light emitting portion 102. The light-emitting device 101 is provided with a light guide plate 106 to which the light emitted from each light emitting portion 102 enters, and is configured such that a surface of the light guide plate 106 planarly emits light.

The heat dissipating member 104 is formed of aluminum, and is formed by extrusion. The heat dissipating member 104 has a mounting substrate 141 formed on one end side of the light guide plate 106 for mounting each light emitting portion 102 and a flange portion 145 covering another end side of the light guide plate 106, and composes an outer frame of the light-emitting device 101. In addition, the plural light emitting portions 102 are mounted electrically in series on a flexible substrate 105. In the present embodiment, plural holes 146 for passing through the flexible substrate 105 are formed in the mounting substrate 141 at predetermined intervals.

After the heat dissipating member 104 is formed by the extrusion, each hole 146 is formed therein by a cutting process. After this, the heat dissipating member 104 is alumite-treated and a heat dissipating film 144 is also formed at an edge portion of each hole 146. As a result, the edge portion of each hole 146 is rounded and it is thereby possible to suppress damage to the flexible substrate 105 and to insulate the flexible substrate 105 by each hole 146.

The heat dissipating film 144 is formed at a portion of the mounting substrate 141 of the heat dissipating member 104 other than an end surface thereof on the light guide plate 106 side. In the present embodiment, the heat dissipating film 144 is an aluminum is oxide coating, and is formed by alumite treatment in a state that a junction 143 is masked.

A Cu plating is entirely applied on the end surface of the mounting substrate 141 on the light guide plate 106 side, and the junction 143 formed of Cu plating is formed on an upper surface of the mounting substrate 141. The junction 143 is formed by plate processing. Then, the light emitting portions 102 are each mounted on each junction 143 via the solder material 103.

FIG. 14 is a vertical cross sectional view showing a light-emitting device.

As shown in FIG. 14, the heat dissipating member 104 has a rear surface portion 147 which covers a rear surface of the light guide plate 106 and couples the mounting substrate 141 to the flange portion 145. In addition, a tip of the flange portion 145 is folded back so as to contact with the surface of the light guide plate 106. The heat dissipating member 104 of the present embodiment is formed by the extrusion.

FIG. 15 is an enlarged vertical cross sectional view showing a light-emitting device.

As shown in FIG. 15, the heat dissipating member 104 has a reflector portion 148 which is continuously formed from the mounting substrate 141 and is in contact with the surface of the light guide plate 106. Although an inner surface of the reflector portion 148 is formed in a parabolic shape in a cross section, it goes without saying that it may be a linear shape. In the present embodiment, the LED element 121 of the light emitting portion 102 is sealed on a mounting substrate 122 by the glass and the light emitting portion 102 has a metal portion on a rear side of the mounting substrate 122 in the same manner as the above-mentioned embodiment, however, it is remarkably different in that the glass surface is curved in a vertical cross section. In addition, an arbitrary material can be selected for the solder material 103, and for example, it is possible to use Sn—Sb-based solder, Sn—Cu-based solder, Sn—Ag-based solder, Sn—Zn-based solder and Sn—Bi-based solder, etc.

According to the light-emitting device 101 configured as described above, since the junction 143 treated so as to be bondable to the solder material 103 is formed on the heat dissipating member 104 formed of aluminum which is difficult to bond to the solder material 103, it is possible to bond the light emitting portion 102 to the heat dissipating member 104 via the solder material 103. In addition, the heat generated by each LED element during the use is smoothly transmitted to the heat dissipating member 104 through the mounting substrate 122 and the solder material 103.

A this time, since the oxide film is not formed on the junction 143 of the heat dissipating member 104, it is possible to strengthen the bonding of the solder material 103 to the heat dissipating member 104. In addition, in the light-emitting device 101 in which a width dimension of the heat dissipating member 104 including the reflector portion 148 is substantially the same as a thickness dimension of the light guide plate 106, although a width of the junction 143 of the heat dissipating member 104 is relatively narrow and a contact area is relatively small, the thermal resistance at the junction 143 is small, thus, the power input to the light emitting portion 2 can be set to large. In addition, it is possible to have a light intensity corresponding to the dimension of the light guide plate 106. Therefore, it is highly advantageous in practical use. Furthermore, even though the heat is generated in each LED element 121, it is possible to maintain the state that the light emitting portion 102 is tightly bonded to the heat dissipating member 104 via the solder material 103, and it is thereby possible to ensure high reliability without separation of the light emitting portion 102 from the heat dissipating member 104 during the use and without an over-time increase in the thermal resistance in the light emitting portion 102 and the heat dissipating member 104.

In addition, according to the light-emitting device 101 of the present embodiment, since the surface of the heat dissipating member 104 is entirely covered by the heat dissipating film 144, heat dissipation performance is dramatically improved. Since the heat dissipating film 144 is formed in a state that the junction 143 is masked, it is possible to simply and easily make the heat dissipating member 104. Alternatively, after applying the Cu plating to a region including the mounting substrate 141 or the whole heat dissipating member 104 and subsequently masking the mounting substrate 141, a white coating may be applied to the light emitting portion 102 other than the mounting substrate 141 using a material which is a resin or inorganic powder such as melamine or acrylic wrapped by polyester or an organic material, e.g., $SiO_2$-based alkoxide containing particles of $TiO_2$ or ZrO, etc. As described above, since the heat dissipation by thermal radiation is enhanced by the white coating and the linear reflectance is not necessarily high for a rear surface reflector of the light guide plate 106, a decrease in the reflectance due to the plating may be compensated by the white coating. Alternatively, an Au plating may be applied to the Cu surface and it is possible to reduce the cost by limiting the application of the expensive Au plating to the necessary portion. Specifically, an acrylic resin, a polyester inorganic powder coating and an inorganic material coating are excellent in stability against light or heat, with less aged deterioration.

In addition, according to the light-emitting device 101 in the present embodiment, the heat is transmitted to the rear surface portion 147 and the flange portion 145 through the mounting substrate 141. As described above, it is possible to efficiently improve the heat dissipation performance of the device by using a frame portion of the light guide plate 106 as a heat dissipating material.

Figure 16:
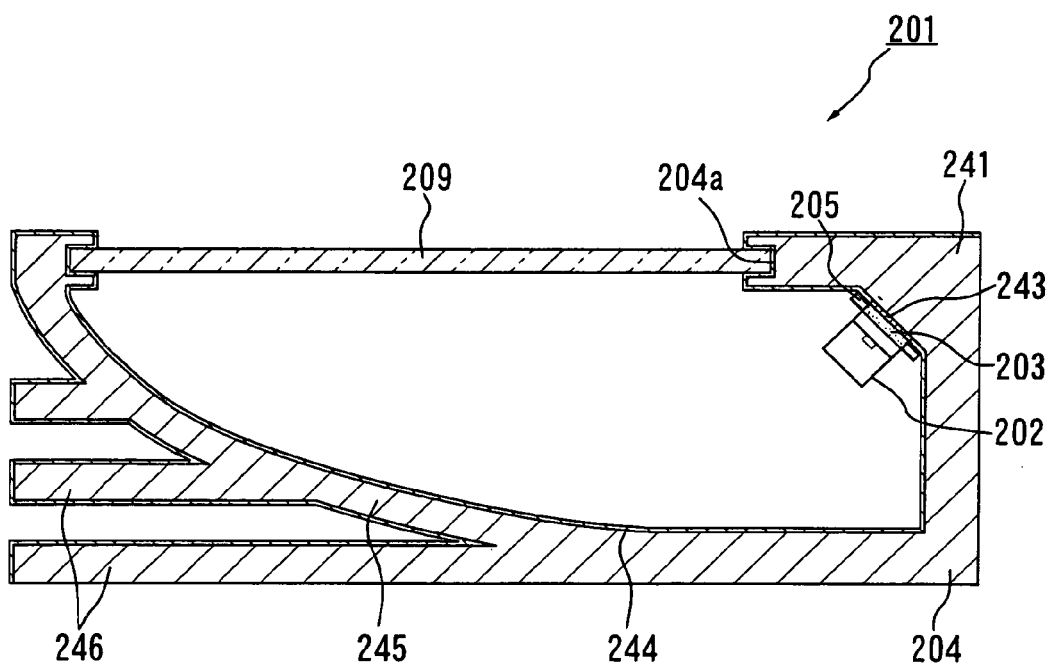
FIG. 16 is a vertical cross sectional view showing a light-emitting device in a third embodiment of the invention.

FIG. 16 is a vertical cross sectional view showing a light-emitting device in a third embodiment of the invention.

As shown in FIG. 16, a light-emitting device 201 is an indirect lighting type, which does not directly radiate the light emitted from a light emitting portion 202 outside but radiates light outside after reflecting at a reflector portion 245. The light-emitting device 201 is provided with a light emitting portion 202 including a LED element, etc., a heat dissipating member 204 connected to the light emitting portion 202 via a solder material 203, and a flexible substrate 205 for supplying power to the light emitting portion 202. In the present embodiment, the heat dissipating member 204 is a housing which houses the light emitting portion 202 and has an opening 204a formed at an upper side. The light-emitting device 201 is provided with a plate-like glass member 209 for closing the opening 204a.

The heat dissipating member 204 is formed of aluminum, and has a mounting substrate 241 at an upper corner of the inside of the housing for mounting the light emitting portion 202 and a reflector portion 245 formed at a portion opposite to the mounting substrate 241. The reflector portion 245 is formed from a lower side of the inside of the housing of the heat dissipating member 204 to the upper corner opposite to the mounting substrate 241, and reflects the light emitted from the light emitting portion 202 toward the opening 204a. In addition, plural fins 246 are formed outside the housing of the reflector portion 245.

The mounting substrate 241 has a junction 243 formed on an inner surface of the housing and the light emitting portion 202 is bonded to the junction 243 by the solder material 203. An arbitrary material can be selected for the solder material 203, and for example, it is possible to use Sn—Sb-based solder, Sn—Cu-based solder, Sn—Ag-based solder, Sn—Zn-based solder and Sn—Bi-based solder, etc. The Ni plating layer and the Au plating layer are laminated on the junction 243 after the zincate treatment, thus, the junction 243 is bondable to the solder material 203.

In addition, a heat dissipating film 244 is formed on the heat dissipating member 204 except on a portion of an outer surface of the housing. In the present embodiment, the heat dissipating film 244 is a white melamine resin, and is entirely formed on the inside of the housing except on the junction 243. The heat dissipating film 244 is formed by white melamine treatment in a state that the junction 243 and the portion of the outer surface of the housing are masked.

The white melamine treatment is performed by, e.g., the following processes.

Firstly, degreasing is performed by spraying non-silicate-based middle alkaline degreaser on the heat dissipating member 204. Next, after the heat dissipating member 204 is washed by the water, a base film is formed by spraying organic titanium-based non-chromate on the heat dissipating member 204. After this, the heat dissipating member 204 is washed by the water and dried. Next, after applying a first coating to the to heat dissipating member 204 using epoxy-based resin baking paint, a top coating is applied to the heat dissipating member 204 using melamine-based resin baking paint. After completing the coating, the heat dissipating member 204 is dried and the white melamine treatment thereto is terminated.

According to the light-emitting device 201 configured as described above, since the junction 243 treated so as to be bondable to the solder material 203 is formed on the heat dissipating member 204 formed of aluminum which is difficult to bond to the solder material 203, it is possible to bond a metal portion of the light emitting portion 202 to the heat dissipating member 204 via the solder material 203. In addition, the heat generated by each LED element during the use is smoothly transmitted to the heat dissipating member 204 through the solder material 203. Therefore, even though the heat is generated in the LED element, it is possible to maintain the state that the light emitting portion 202 is tightly bonded to the heat dissipating member 204 via the solder material 203, and it is thereby possible to ensure high reliability without separation of the light emitting portion 202 from the heat dissipating member 204 during the use and without an over-time increase in the thermal resistance between the light emitting portion 202 and the heat dissipating member 204.

In addition, according to the light-emitting device 201 of the present embodiment, since the surface of the heat dissipating member 204 is entirely covered by the heat dissipating film 244, heat dissipation performance is dramatically improved. Since the heat dissipating film 244 is formed in a state that the junction 243 is masked, it is possible to simply and easily make the heat dissipating member 204. In addition, since the heat dissipating film 244 is the white melamine coating, reflectance with respect to the light emitted from the light emitting portion 202 is high. Therefore, it is possible to accurately reflect the light emitted from the light emitting portion 202 toward the opening 204a by the heat dissipating film 244 formed on the inner surface of the reflector portion 245. In addition, since the light is scatter-reflected at the white melamine-coated surface, external radiation is possible while suppressing glare.

In addition, according to the light-emitting device 201 in the present embodiment, the heat is transmitted to the entire heat dissipating member 204 through the mounting substrate 241. As described above, it is possible to efficiently improve the heat dissipation performance of the device by using the housing-shaped heat dissipating member 204.

Figure 17:
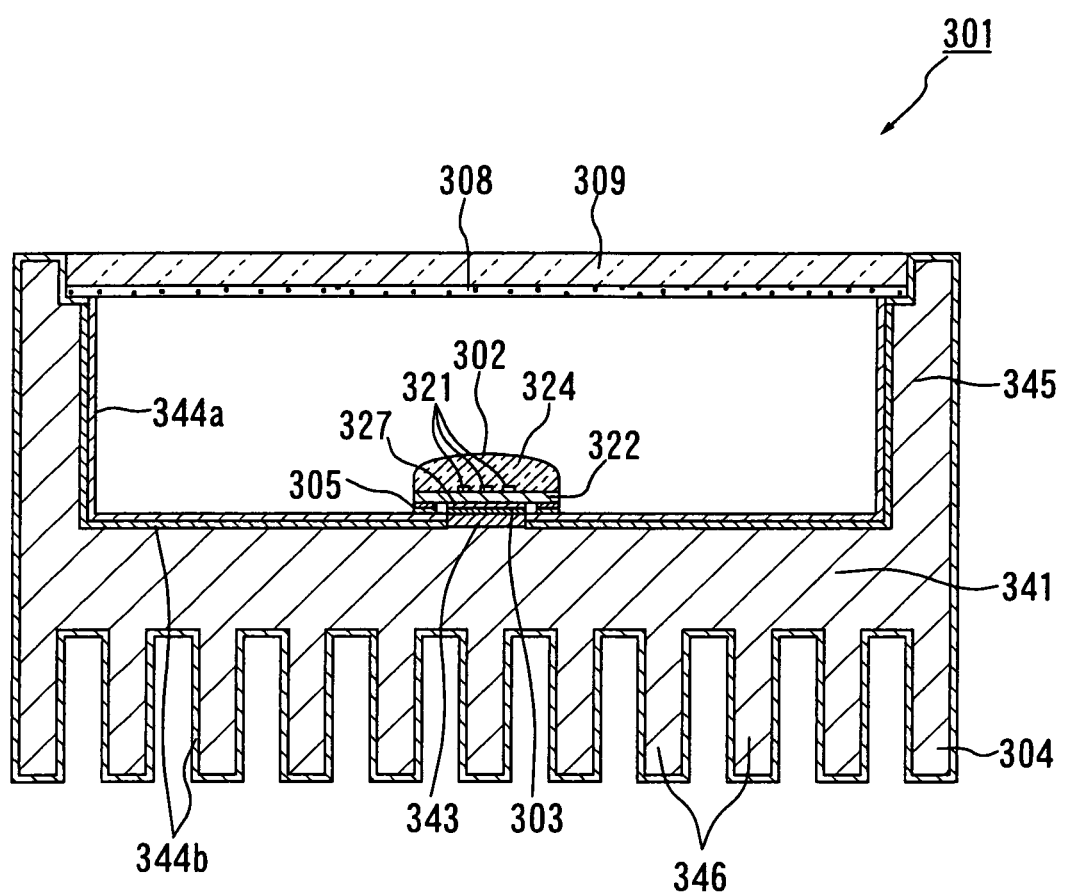
FIG. 17 is a vertical cross sectional view showing a light-emitting device in a fourth embodiment of the invention.

FIG. 17 is a vertical cross sectional view showing a light-emitting device in a fourth embodiment of the invention.

As shown in FIG. 17, a light-emitting device 301 is provided with a light emitting portion 302 including a LED element, etc., a heat dissipating member 304 connected to the light emitting portion 302 via a solder material 303, and a flexible substrate 305 for supplying power to the light emitting portion 302. An arbitrary material can be selected for the solder material 303, for example, it is possible to use Sn—Sb-based solder, Sn—Cu-based solder, Sn—Ag-based solder, Sn—Zn-based solder and Sn—Bi-based solder, etc. In the present embodiment, the heat dissipating member 304 is a housing which houses the light emitting portion 302 and has an opening 304a formed at an upper side. The light-emitting device 301 is provided with a plate-like glass member 309 for closing the opening 304a.

The light emitting portion 302 has plural LED elements 321 which emit ultraviolet light, a mounting substrate 322 for mounting the LED elements 321 and a sealing portion 324 for sealing each LED element 321 on the mounting substrate 322. Each LED element 321 is flip-chip-type and a GaN-based semiconductor layer is formed on a GaN substrate by epitaxial growth. In detail, an emission wavelength of each LED element 321 is 380-390 nm. As shown in FIG. 17, in the present embodiment, nine LED elements 321 in total, three each for vertical and horizontal directions, are mounted on one mounting substrate 322. In addition, the mounting substrate 322 is a ceramic substrate formed of $Al_2O_3$, and a metal layer 327 formed of Cu plating-treated so as to be bondable to the solder material 303 is formed on the entire lower surface of the mounting substrate 322. The sealing portion 324 is formed of a ZnO-based glass having a refractive index of 1.8, and an upper surface thereof has a condenser lens shape.

A phosphor layer 308 containing phosphor is formed on a lower side of the glass member 309. The phosphor layer 308 contains blue, green and red phosphors which are excited by ultraviolet light radiated from the light emitting portion 302. The glass member 309 is formed of, e.g., Pyrex (registered trademark) glass and a dichroic mirror which reflects light of 400 nm or less may be formed on a surface thereof.

The heat dissipating member 304 is formed of aluminum, and has a main body 341 to which the light emitting portion 302 is connected via the solder material 303, plural fins 346 formed downwardly protruding from the main body 341, a junction 343 provided on an upper surface of the main body 341, and a wall 345 extending upwardly from an outer edge of the main body 341. The junction 343 is formed by laminating the Zn plating layer, the Ni plating layer and the Au plating layer. The heat dissipating member 304 is formed in a substantially square shape in a planar view, and the main body 341, each fin 346 and the wall 345 are formed by die-casting aluminum.

In addition, an upper surface of the main body 341 and an inner surface of the wall 345 of the heat dissipating member 304 are covered by a first heat dissipating film 344a. The first heat dissipating film 344a is formed in a periphery of the junction 343. In the present embodiment, the first heat dissipating film 344a is formed of a white melamine resin.

A lower surface of the main body 341, an outer surface of the wall 345 and each fin 346 of the heat dissipating member 304 are covered by a second heat dissipating film 344b. In the present embodiment, the second heat dissipating film 344b is an aluminum oxide coating, and is formed by the alumite treatment.

After the second heat dissipating film 344b is formed by applying entirely the alumite treatment, the first heat dissipating film 344a is formed by the limited melamine treatment, thereby manufacturing the heat dissipating member 304. As a result, the first heat dissipating film 344a is formed on the second heat dissipating film 344b on the upper surface of the main body 341 and the inner surface of the wall 345. Then, after removing the heat dissipating films 344a and 344b at a portion for forming the junction 343, the Zn plating layer is formed by the zincate treatment, and the Ni plating layer and the Au plating layer are sequentially formed, thereby forming the junction 343.

According to the light-emitting device 301 configured as described above, since the junction 343 treated so as to be bondable to the solder material 303 is formed on the heat dissipating member 304 formed of aluminum which is difficult to bond to the solder material 303, it is possible to bond the light emitting portion 302 to the heat dissipating member 304 via the solder material 303. In addition, the heat generated by each LED element 321 during the use is smoothly transmitted to the main body 341 of the heat dissipating member 304 through the solder material 303. At this time, since the oxide film is not formed on the junction 343 of the heat dissipating member 304, it is possible to strengthen the bonding of the solder material 303 to the heat dissipating member 304 and to reduce the thermal resistance between the mounting substrate 322 and the main body 341, thus, it is highly advantageous in practical use. Therefore, even though the heat is generated in each LED element 321, it is possible to maintain the state that the light emitting portion 302 is tightly bonded to the heat dissipating member 304 via the solder material 303, and it is thereby possible to ensure high reliability without separation of the light emitting portion 302 from the heat dissipating member 304 during the use and without an over-time increase in the thermal resistance between the light emitting portion 302 and the heat dissipating member 304.

In addition, according to the light-emitting device 301 in the present embodiment, since the surface of the heat dissipating member 304 is entirely covered by the heat dissipating films 344a and 344b, heat dissipation performance is dramatically improved. In addition, since the first heat dissipating film 344a is the white melamine coating, reflectance with respect to the light emitted from the light emitting portion 302 is high.

In addition, according to the light-emitting device 301 in the present embodiment, the heat is transmitted to the entire heat dissipating member 304 through the main body 341. As described above, it is possible to efficiently improve the heat dissipation performance of the device by using the housing-shaped heat dissipating member 304.

Figure 18:
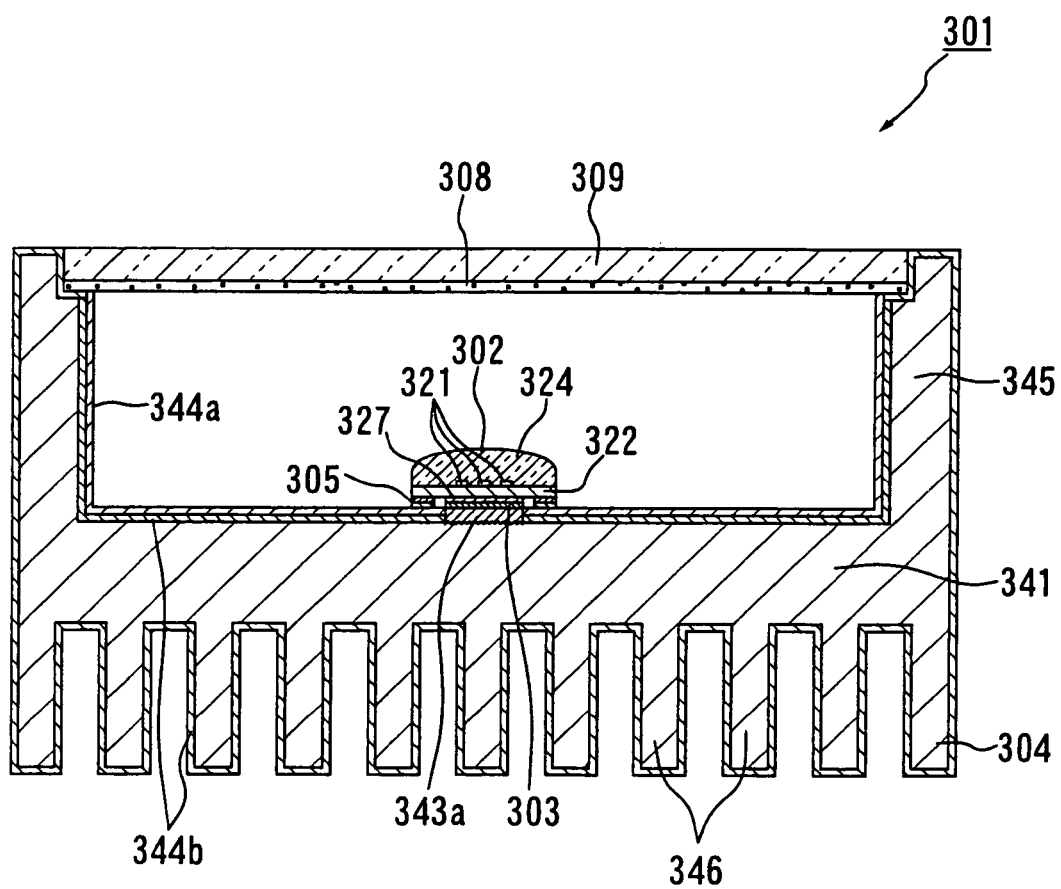
FIG. 18 is a vertical cross sectional view showing a light-emitting device in a modification.

Although it is shown that the junction 343 is formed by the zincate treatment in the fourth embodiment, for example, a junction 343a may be formed by embedding a small piece formed of Cu into the main body 341 as shown in FIG. 18.

In addition, although the heat dissipating member formed of aluminum is shown in the above-mentioned each embodiment, it is possible to obtain the same effect as the above-mentioned each embodiment when the heat dissipating member is aluminum alloy, magnesium or magnesium alloy since the oxide film is likely to be formed on a surface thereof. Moreover, the shape of the heat dissipating member, etc., can be arbitrarily appropriately changed, and other specific detailed structure, etc., can be, of course, appropriately changed.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A light-emitting device, comprising: a light emitting portion comprising a substrate comprising a mounting surface for mounting a light-emitting diode (LED) element and a metal portion formed on a surface of the substrate opposite to the mounting surface, the substrate comprising a ceramic or a semiconductor and the metal portion being bondable to a solder material; a heat dissipating member comprising one of aluminum, an aluminum alloy, magnesium and a magnesium alloy; and a circuit pattern formed on the heat dissipating member and electrically connected to the LED element of the light emitting portion by mounting the light emitting portion on the heat dissipating member, wherein a surface of the heat dissipating member includes a junction treated so as to be bondable to the solder material and a heat dissipating film formed in a periphery of the junction, wherein the metal portion of the light emitting portion is bonded to the junction of the heat dissipating member by the solder material, wherein no oxide film is formed on the junction of the heat dissipating member, wherein the solder material comprises a material that is impossible to be directly bonded to the heat dissipating member, wherein the heat dissipating member further comprises a plate-shaped main body, wherein the light emitting portion is mounted on an end surface of the main body of the heat dissipating member, and wherein a longitudinal length of the end surface in the metal portion of the light emitting portion is less than 200/X [mm] where X [10-6/° C.] is a difference between a rate of thermal expansion of the heat dissipating member and a rate of thermal expansion of the substrate of the light emitting portion.

2. The light-emitting device according to claim 1, wherein the main body includes a flat surface, and
wherein a product of the difference between the rate of thermal expansion of the heat dissipating member and the rate of thermal expansion of the substrate of the light emitting portion, and the longitudinal length of the end surface of the light emitting portion in the metal portion is 0.2 μm/° C. or less.

3. The light-emitting device according to claim 2, wherein the heat dissipating member further comprises a reflector portion continuously formed from the main body so as to cover the light emitting portion on both sides in a width direction of the end surface for reflecting light emitted from the light emitting portion.

4. The light-emitting device according to claim 3, wherein a value of a dimension derived by dividing the metal portion of the light emitting portion by input power to the light emitting portion is 500 mm$^2$/W or less.

5. The light-emitting device according to claim 4, wherein the light emitting portion further comprises a glass sealing portion for sealing the LED element.

6. The light-emitting device according to claim 5, wherein the light emitting portion comprises a plurality of light emitting portions arranged in a row for forming a linear light source.

7. The light-emitting device according to claim 6, wherein the junction comprises one of Zn plating, V-plating and Cu plating.

8. A method of manufacturing the light-emitting device according to claim 1, said method comprising:
   forming the heat dissipating film on a surface of the heat dissipating member in a state that the junction of the heat dissipating member is covered with a masking member; and
   after exposing the junction by removing the masking member, treating the junction so as to be bondable to the solder material.

9. The method of manufacturing the light-emitting device according to claim 8, wherein the heat dissipating film is formed by an alumite treatment.

10. The light-emitting device according to claim 1, wherein the metal portion is disposed on the surface of the substrate opposite to the mounting surface.

11. The light-emitting device according to claim 1, wherein an upper surface of the metal portion abuts the surface of the substrate opposite to the mounting surface.

12. The light-emitting device according to claim 1, wherein the solder material is disposed between the junction and the metal portion.

13. The light-emitting device according to claim 1, wherein an upper surface of the solder material abuts the metal portion and a bottom surface of the solder material abuts the junction.

14. The light-emitting device according to claim 13, wherein the upper surface of the solder material further abuts the substrate.

15. The light-emitting device according to claim 1, wherein the heat dissipating film is disposed on surfaces of the heat dissipating member such that the heat dissipating film and the junction encircle a periphery of the heat dissipating member.

16. A light-emitting device, comprising: a light emitting portion, comprising: a substrate comprising a mounting surface for mounting a light-emitting diode (LED) element; and mounting surface, the substrate comprising one of a ceramic and a semiconductor; a solder material bonded to the metal portion;
   a heat dissipating member, wherein a surface of the heat dissipating member comprises a junction treated to be bonded to the metal portion via the solder material; a heat dissipating film disposed in a periphery of the junction; and a circuit pattern formed on the heat dissipating member and electrically connected to the LED element of the light emitting portion by mounting the light emitting portion on the heat dissipating member,
   wherein no oxide film is formed on the junction of the heat dissipating member, wherein the solder material comprises a material that is impossible to be directly bonded to the heat dissipating member, wherein the heat dissipating member further comprises a plate-shaped main body,
   wherein the light emitting portion is mounted on an end surface of the main body of the heat dissipating member, and wherein a longitudinal length of the end surface in the metal portion of the light emitting portion is less than 200/X [mm] where X [10-6/° C.] is a difference between a rate of thermal expansion of the heat dissipating member and a rate of thermal expansion of the substrate of the light emitting portion.

17. The light-emitting device according to claim 16, wherein the heat dissipating member comprises one of aluminum, an aluminum alloy, magnesium, and a magnesium alloy.

18. The light-emitting device according to claim 16, wherein an upper surface of the solder material abuts a bottom surface of the metal portion and the substrate, and a bottom surface of the solder material abuts the junction.

19. The light-emitting device according to claim 16, wherein the heat dissipating film is disposed on surfaces of the heat dissipating member such that the heat dissipating film and the junction encircle a periphery of the heat dissipating member.

* * * * *